(12) United States Patent
Sundaresan et al.

(10) Patent No.: US 11,031,461 B2
(45) Date of Patent: Jun. 8, 2021

(54) MANUFACTURE OF ROBUST, HIGH-PERFORMANCE DEVICES

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GeneSiC Semiconductor Inc., Dulles, VA (US)

( * ) Notice: Subject to any disclaimer, the term of this patent is extended or adjusted under 35 U.S.C. 154(b) by 4 days.

(21) Appl. No.: 16/550,249

(22) Filed: Aug. 25, 2019

(65) Prior Publication Data

US 2021/0057519 A1    Feb. 25, 2021

(51) Int. Cl.
*H01L 29/06* (2006.01)
*H01L 29/16* (2006.01)
*H01L 29/66* (2006.01)
*H01L 29/78* (2006.01)
*H01L 29/10* (2006.01)
*H01L 21/04* (2006.01)

(52) U.S. Cl.
CPC ...... *H01L 29/0607* (2013.01); *H01L 29/1045* (2013.01); *H01L 29/1608* (2013.01); *H01L 29/66068* (2013.01); *H01L 29/7802* (2013.01); *H01L 21/0465* (2013.01)

(58) Field of Classification Search
CPC ............. H01L 29/0607; H01L 29/1045; H01L 29/1608; H01L 29/66068; H01L 29/7802; H01L 21/0465
See application file for complete search history.

(56) References Cited

U.S. PATENT DOCUMENTS 10,840,385 B1* 11/2020 Sundaresan ......... H01L 29/6606
2018/0166530 A1* 6/2018 Lichtenwalner .... H01L 29/1095

* cited by examiner

*Primary Examiner* — Seahvosh Nikmanesh
(74) *Attorney, Agent, or Firm* — Dave Law Group LLC; Raj S. Dave

(57) ABSTRACT

An embodiment relates to a device comprising SiC, the device having a p-shield region that is outside a junction gate field-effect transistor region, wherein a doping concentration in a p-well region within a MOSFET channel is non-uniform. Another embodiment relates to a device comprising SiC, the device having a p-shield region, wherein a doping concentration in a p-well region within a MOSFET channel is non-uniform, wherein at least a portion of the p-shield region is located within the p-well region.

20 Claims, 37 Drawing Sheets

Fig. 9.16 Threshold Voltage of 4H-SiC Planar MOSFETs.

MANUFACTURE OF ROBUST, HIGH-PERFORMANCE DEVICES

RELATED APPLICATION

The present application is related to previously filed patent U.S. applications whose official filing details are as follows: U.S. patent application Ser. No. 16/352,698, filed Mar. 13, 2019, U.S. patent application Ser. No. 16/431,655, filed Jun. 4, 2019 and U.S. patent application Ser. No. 16/374,025, filed Apr. 3, 2019, respectively, which are incorporated herein by reference in their entirety.

FIELD OF THE INVENTION

This invention relates to power semiconductor devices using a vertical silicon carbide (SiC) double-implantation metal oxide semiconductor field-effect transistor (DMOSFET). A power metal oxide semiconductor field-effect transistor (MOSFET) is a specific type of MOSFET designed to handle significant power levels.

BACKGROUND OF INVENTION

Silicon based power devices have long dominated power electronics and power system applications. On the other hand, SiC is a wider band-gap (Eg) material with Eg=3.3 eV as compared to silicon (Eg=1.1 eV) and hence, SiC has a higher blocking voltage than Si. SiC has a higher breakdown electric field ($3 \times 10^6$ V/cm to $5 \times 10^6$ V/cm) compared to Si (breakdown electric field for Si is $0.3 \times 10^6$ V/cm) and is a better thermal conductor (3.7 (W/cm-K) for SiC versus 1.6 (W/cm-K) for Si). SiC has been a material of choice for power MOSFETs.

However, "[t]hreshold voltage of the power MOSFET is an important design parameter from an application standpoint. A minimum threshold voltage must be maintained at above 1 volt for most system applications to provide immunity against turn-on due to voltage spikes arising from noise. At the same time, a high threshold voltage is not desirable because the voltage available for creating the charge in the channel inversion layer is determined by ($V_G-V_T$) where $V_G$ is the applied gate bias and $V_T$ is the threshold voltage." [source: B. J. Baliga, Silicon Carbide Power Devices, Springer Press (2005), Page 234]

FIG. 1 [source: B. J. Baliga, Silicon Carbide Power Devices, Springer Press (2005), Page 235] shows the threshold voltage of 4H-SiC planar MOSFETs for the case of a gate oxide thickness of 0.1 microns. The results obtained for a silicon power MOSFET with the same gate oxide thickness is also provided in the figure for comparison.

In the race to achieve lower $R_{DS,ON}$ of planar gate SiC MOSFETs with high breakdown voltage ratings, it is a common practice to make the channel lengths ($L_{CH}$) as short as possible which reduces a great part of the conduction loss that is associated to the channel. The trade-off in doing so is that, as the channel lengths are becoming shorter, the MOSFET devices become susceptible to undesirable phenomena such as the DIBL effect (the Drain Induced Barrier Lowering effect) which is responsible for the poor device performance including but not limited to the roll-off of the threshold voltage ($V_{TH}$) at high drain bias and the increase of the drain leakage ($I_L$) at high drain bias. A conventional approach to mitigate this problem is to uniformly increase the doping concentration in the channel region, but this approach suffers from a higher than optimal gate threshold voltage and on-resistance, which can offset the gains achieved from the channel length reduction.

SUMMARY OF INVENTION

An embodiment relates to a device comprising SiC, the device comprising a MOSFET channel, a junction gate field-effect transistor region, a first conductivity type well region or a second conductivity type well region, and a first conductivity type shield region or a second conductivity type shield region, wherein the first conductivity type shield region or the second conductivity type shield region is outside the junction gate field-effect transistor region, and wherein a doping concentration in the first conductivity type well region or the second conductivity type well region within the MOSFET channel is non-uniform.

In an embodiment, the first conductivity type shield region or the second conductivity type shield region is located inside the first conductivity type well region or the second conductivity type well region in a manner that a lateral location of a point having a higher doping concentration than that of an average background doping concentration of the first conductivity type well region or the second conductivity type well region is positioned within the first conductivity type well region or the second conductivity type well region.

In an embodiment, the first conductivity type shield region or the second conductivity type shield region extends beyond the first conductivity type well region or the second conductivity type well region.

In an embodiment, the first conductivity type shield region or the second conductivity type shield region extends beyond a vertical extent of the first conductivity type well region or the second conductivity type well region.

In an embodiment, the device comprises multiple second conductivity type shield regions.

In an embodiment, doping concentration profiles of the first conductivity type shield region or the second conductivity type shield region in different regions are different.

In an embodiment, doping concentration profiles of the first conductivity type shield region or the second conductivity type shield region in different regions are not substantially different.

Another embodiment relates to a device comprising SiC, the device comprising a MOSFET channel, a first conductivity type well region or a second conductivity type well region, and a first conductivity type shield region or a second conductivity type shield region, wherein a doping concentration in the first conductivity type well region or the second conductivity type well region within the MOSFET channel is non-uniform, and wherein at least a portion of the first conductivity type shield region or the second conductivity type shield region is located within the first conductivity type well region or the second conductivity type well region.

In an embodiment, the first conductivity type shield region or the second conductivity type shield region is outside a junction gate field-effect transistor region.

In an embodiment, the first conductivity type shield region or the second conductivity type shield region extends beyond the first conductivity type well region or the second conductivity type well region.

In an embodiment, the first conductivity type shield region or the second conductivity type shield region extends beyond a vertical extent of the first conductivity type well region or the second conductivity type well region.

In an embodiment, there comprises multiple second conductivity type shield regions.

In an embodiment, doping concentration profiles of the first conductivity type shield region or the second conductivity type shield region in different regions are different.

In an embodiment, doping concentration profiles of the first conductivity type shield region or the second conductivity type shield region in different regions are not substantially different.

Another embodiment relates to a method comprising forming a MOSFET channel, forming a junction gate field-effect transistor region, forming a first conductivity type well region or a second conductivity type well region, forming a first conductivity type shield region or a second conductivity type shield region, and forming a device comprising SiC; wherein the first conductivity type shield region or the second conductivity type shield region is outside the junction gate field-effect transistor region, and wherein a doping concentration in the first conductivity type well region or the second conductivity type well region within the MOSFET channel is non-uniform.

In an embodiment, the first conductivity type shield region or the second conductivity type shield region is located inside the first conductivity type well region or the second conductivity type well region in a manner that a lateral location of a point having a higher doping concentration than that of an average background doping concentration of the first conductivity type well region or the second conductivity type well region is positioned within the first conductivity type well region or the second conductivity type well region.

In an embodiment, the first conductivity type shield region or the second conductivity type shield region extends beyond the first conductivity type well region or the second conductivity type well region.

Another embodiment relates to a method comprising forming a MOSFET channel, forming a first conductivity type well region or a second conductivity type well region, forming a first conductivity type shield region or a second conductivity type shield region, and forming a device comprising SiC; wherein a doping concentration in the first conductivity type well region or the second conductivity type well region within the MOSFET channel is non-uniform, and wherein at least a portion of the first conductivity type shield region or the second conductivity type shield region is located within the first conductivity type well region or the second conductivity type well region.

In an embodiment, doping concentration profiles of the first conductivity type shield region or the second conductivity type shield region in different regions are different.

In an embodiment, doping concentration profiles of the first conductivity type shield region or the second conductivity type shield region in different regions are not substantially different.

BRIEF DESCRIPTION OF THE FIGURES

FIG. 3a to FIG. 3u are cross sectional views showing the process steps for manufacturing the SiC DMOSFET structure in FIG. 2a.

FIG. 5a to FIG. 5u are cross sectional views showing the process steps for manufacturing the SiC DMOSFET structure in FIG. 4a.

DETAILED DESCRIPTION

Definitions and General Techniques

Figure 1:
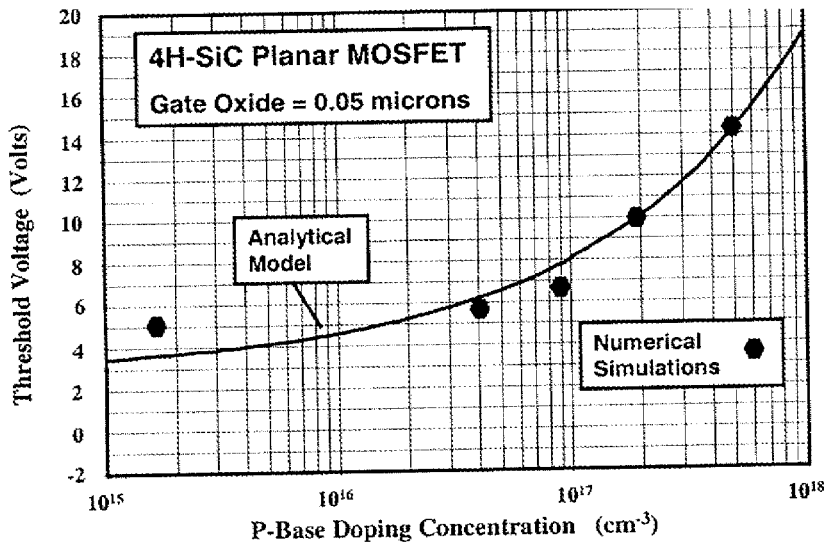
FIG. 1 is the prior art and shows the plot of threshold voltage versus p-base doping concentration for a 4H-SiC Planar MOSFET.

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer and the letter indicates the Bravais lattice. That means in a 4H-SiC structure four hexagonal layers of SiC are present. SiC exists in a kind of polymorphic crystalline building known as a polytype, e.g. 3C-SiC, 4H-SiC, 6H-SiC. Presently 4H-SiC is used in power device manufacturing.

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

The term "MOSFET" as used herein refers to metal oxide semiconductor field-effect transistor. which is a four terminal device with source (S), gate (G), drain (D) and body (B)

terminals. The body of the MOSFET is frequently connected to the source terminal so making it a three terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor.

The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "PN junction" as used herein refers to the interface and region of transition between p-type and n-type semiconductors.

The term "polysilicon" as used herein refers to a polycrystalline form of silicon.

The term "p-type" as used herein refers to extrinsic semiconductor in which the hole density exceeds the conduction electron density.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "breakdown" as used herein refers to a sudden change from high dynamic electrical resistance to a very low dynamic resistance in a reverse biased semiconductor device (e.g., a reverse biased junction between p-type and n-type semiconductor materials) wherein reverse current increases rapidly for a small increase in reverse applied voltage, and the device behaves as if it had negative electrical resistance.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "die" as used herein refers to a tiny piece of semiconductor material, separated from a semiconductor slice, on which one or more active electronic components are formed. It is sometimes called a chip.

The term "sinker" as used herein refers to deep implanted regions at key locations within the DMOSFET structure The term "plug" as used herein refers to the structure used to ground the well and the source contact.

The term "drift layer" as used herein refers to lightly doped region to support the high voltage in power MOSFET The term "well" used herein refers certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "source interconnect metallization" as used herein refers to interconnection metallization that interconnects many MOSFETs using fine-line metal patterns.

The term "self-aligned" used herein refers to processing steps in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a non-conductor of electricity, otherwise known as an insulator.

The term "mobility" as used herein refers to the facility with which carriers move through a semiconductor when subjected to an applied electric field. Electrons and holes typically have different mobilities in the same semiconductor.

The term "ME" as used herein refers to reactive ion etching which is an etching technology used in microfabrication. RIE is a type of dry etching which has different characteristics than wet etching. ME uses chemically reactive plasma to remove material deposited on wafers. The plasma is generated under low pressure (vacuum) by an electromagnetic field. High-energy ions from the plasma attack the wafer surface and react with it.

The term "ILD" as used herein refers to interlayer dielectric a dielectric material used to electrically separate closely spaced interconnect lines arranged in several levels (multi-level metallization) in an advanced integrated circuit.

The term "CVD" as used herein refers to chemical vapor deposition is method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

The term "PECVD" as used herein refers to plasma-enhanced chemical vapor deposition process used to deposit thin films from a gas state (vapor) to a solid state on a substrate. Chemical reactions are involved in the process, which occur after creation of a plasma of the reacting gases.

The term "LPCVD" as used herein refers to low pressure chemical vapor deposition technology that uses heat to initiate a reaction of a precursor gas on the solid substrate. This reaction at the surface is what forms the solid phase material.

The term "DIBL" as used herein refers to drain induced barrier lowering and is a short-channel effect in MOSFETs referring originally to a reduction of threshold voltage of the transistor at higher drain voltages. In a classic planar field-effect transistor with a long channel, the bottleneck in channel formation occurs far enough from the drain contact that it is electrostatically shielded from the drain by the combination of the substrate and gate, and so classically the threshold voltage was independent of drain voltage. In short-channel devices this is no longer true: The drain is close enough to gate the channel, and so a high drain voltage can open the bottleneck and turn on the transistor prematurely.

The term "p-shield" as used herein refers to a carefully designed p-type doped region strategically located close to or within the MOSFET channel region, with the objective of shielding the MOSFET channel from the high potential applied to the drain terminal during off-state or blocking operation.

The terms "first conductivity type region" and "second conductivity type region" as used herein, are used to describe n-type and p-type regions respectively for a N type device. For a P type device "first conductivity type region" and "second conductivity type region" are used to describe p-type and n-type regions respectively.

An embodiment described herein relates to design and manufacturing of a short-channel SiC MOSFET.

An embodiment described herein relates to minimizing the DIBL effect of the high voltage, short-channel SiC MOSFETs.

An embodiment described herein relates to improved device reliability.

An embodiment described herein relates to reducing ON resistance for a given chip size.

An embodiment described herein relates to design and manufacturing MOS channels with sub-micron channel lengths.

The embodiments described herein achieve a device with both low enough ON resistance as well as, high enough short circuit withstand time.

The embodiments described herein relate to increasing the doping concentration of the channel locally in certain regions of the channel. The non-uniformly doped channels for SiC MOSFET provide better tradeoff between ON resistance, threshold voltage and short circuit withstand time.

In the embodiments described herein relate to increasing the doping concentration in the channel locally such that they do not increase the threshold voltage too much, but at the same time reduce the DIBL effect to achieve a better trade of.

In an embodiment described herein a p-type shielding layer called the p-shield is formed within the p-well region. The p-shield always originates within the p-well region, but it can extend beyond the vertical extent of the p-well region.

In an embodiment described herein the bottom of the p-shield region can extended beneath the p-well.

In an embodiment described herein there can be multiple p-shield regions. The doping concentrations in the different p-shield region can be different from each other.

The embodiment described herein relates to device where a p-shield region is formed buried within the p-well structure. The p-shield region always originates within the p-well region, but can extend beyond the vertical extent of the p-well region.

In an embodiment herein, device structures can have multiple p-shield regions. In these cases, their doping concentration profiles of the different p-shield regions do not necessarily have be the same and can be different from each other.

In the race to achieve a lower ON stage resistance in planar gate SiC MOSFET, especially with high breakdown voltage ratings, it's a common practice to make the channel lengths as short as possible because this reduces a great part of the conduction loss that is associated with SiC channels. The MOS mobility in SiC MOS structures is significantly smaller as compared to those found in silicon MOSFETS and as a result to achieve a low enough ON resistance, one needs to make the channel lengths quite short and sometimes in the sub-micron range.

As the channel lengths become shorter, short channel effects becomes a problem in a SiC power MOSFET causing the drain induced barrier lowering effect, also called the DIBL effect which is responsible for a lot of reliability issues in SiC MOSFETs.

One associated problem is a roll off of the threshold voltage at high drain bias where the designed device achieves a certain desired threshold voltage only at very low drain bias. But, as the drain bias approaches it's blocking value, the threshold voltage gets reduced substantially which is undesirable since the channel could inadvertently turn on.

Also, a device suffering the DIBL effect has extremely large saturation currents under high drain bias. which results in excessive power dissipation under short circuit load conditions. This results in a low short circuit withstand time. While limited MOS channel mobility of SiC MOSFETS can be overcome with short channel lengths, it is associated with problems due to DIBL effects.

One approach to mitigating this problem is to increase the doping concentration in the channel region which uniformly increases the threshold voltage of the device. While this approach can reduce the saturation drain current, this also increases the ON resistance of the device.

The embodiments described herein can help achieve a device with both low enough ON resistance as well as, high enough short circuit withstand time. While the conventional approach is to just uniformly increase the doping concentration in the channel region, the embodiments described herein do not increase the doping concentration of the other channel uniformly but increases it locally in certain regions of the channel. The non-uniformly doped channels for SiC MOSFET provide better tradeoff between ON resistance, threshold voltage and short circuit withstand time.

In the embodiments herein the doping concentration are increased such that they do not increase the threshold voltage too much, but at the same time reduce the DIBL effect and hence achieving a better trade of.

In an embodiment herein a p-type shielding layer called the p-shield is formed within the p-well region. The p-shield always originates within the p-well region, but in certain examples of this embodiment, it can extend beyond the vertical extent of the p-well region.

In an embodiment herein the bottom of the p-shield region can be extended further down and can reach beneath the p-well. In an embodiment herein there can be multiple p-shield regions. The doping concentrations in the different p-shield region can be different from each other.

In an embodiment herein a p-type shielding layer called the p-shield is formed buried within the p-well region. The p-shield always originates within the p-well region, but in certain examples of this embodiment, it can extend beyond the vertical extent of the p-well region.

In an embodiment herein the bottom of the p-shield region can be extended further down and can reach beneath the p-well. In an embodiment herein there can be multiple p-shield regions buried in the p-well region. The doping concentrations in the different p-shield region can be different from each other.

A p-shield region is formed buried within the p-well structure re-enforces" the doping of the p-well region locally and provides better shielding of the MOSFET channel at the surface, while minimizing the DIBL effect. In the embodiment described herein since the p-shield is not directly connected to the channel, the p-shield does not change the $V_{TH}$.

Figure 2A:
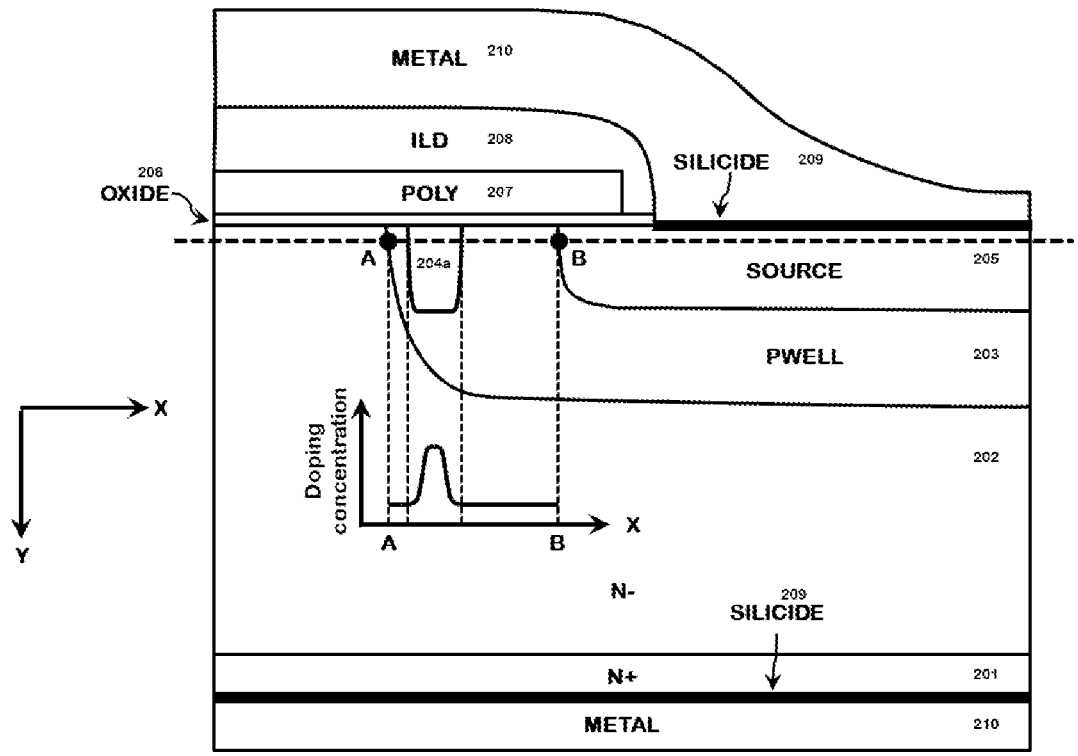
FIG. 2a to FIG. 2d shows embodiments of a SiC DMOS-FET structure for field shielding within the p-well region.

An embodiment shown in FIG. 2a is the half unit cell of a cross-sectional structure of a SiC DMOSFET. The key regions of this device are a p-well region 203, which is formed by ion-implantation or epitaxial re-growth of a p-type species such as aluminum or boron. There is an N+ source region 205, N− drift layer 202, and an N+ substrate 201. In the ON state when a gate voltage is applied to the polysilicon gate 207 the current flows vertically from the drain 201, through the inversion layer which is formed at the top of the p-well layer 203, through the N+ source region 205, and out through the source metallization 210. In the OFF state or the blocking state, a voltage is supported across the p-well 203, N− drift layer 202 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the junction gate field-effect transistor (JFET) region or the JFET gap and the thickness of the gate oxide 206. Another feature is an ILD layer 208 which is used to insulate the source interconnect metallization 210 from the polysilicon gate 207.

In the embodiments herein a p-type shielding layer which is called p-shield 204a is formed within the p-well region. The p-shield can be located inside the p-well such that its lateral location of the point whose doping concentration is the highest as compared to the average background doping concentration of the p-well is positioned within the boundary of the p-well. The p-shield region always originates within the p-well region. Point A and B are given as the reference points for describing how the doping profile of the implanted p-shield region looks like.

Figure 2B:
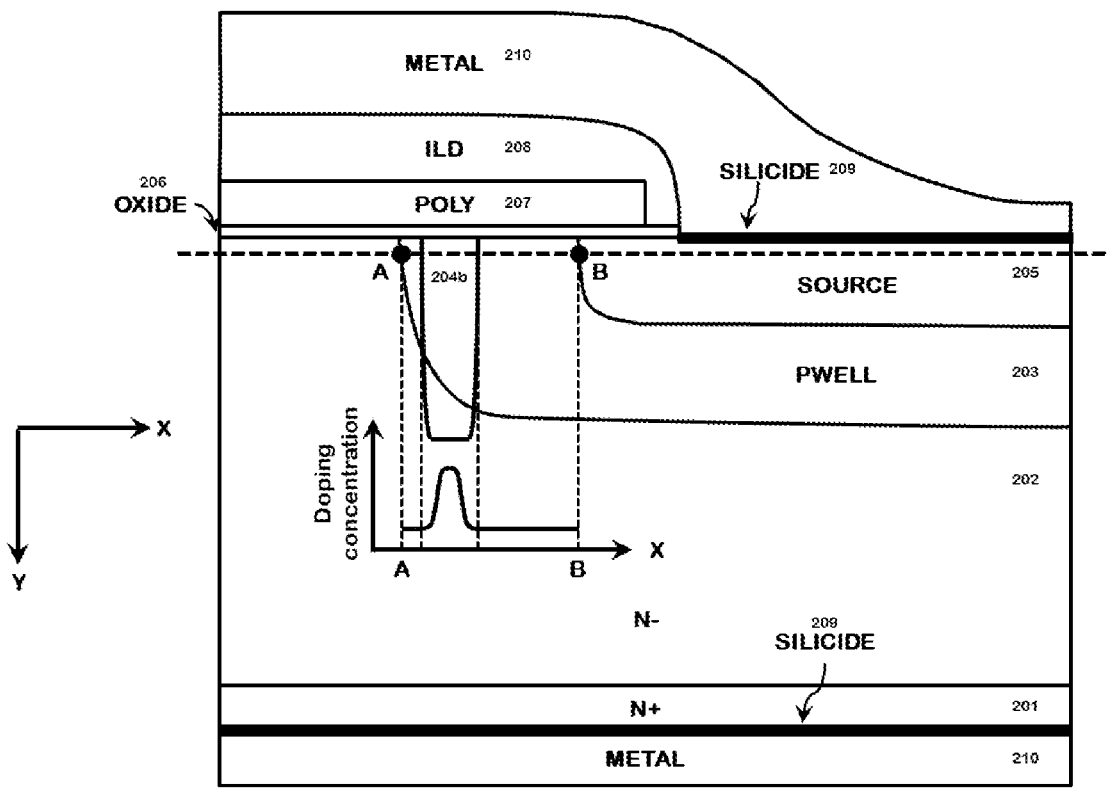

The embodiment shown in FIG. 2b is similar to that of FIG. 2a except that the bottom of the p-shield region is extended further down into the p-well and can reach outside the p-well region.

Figure 2C:
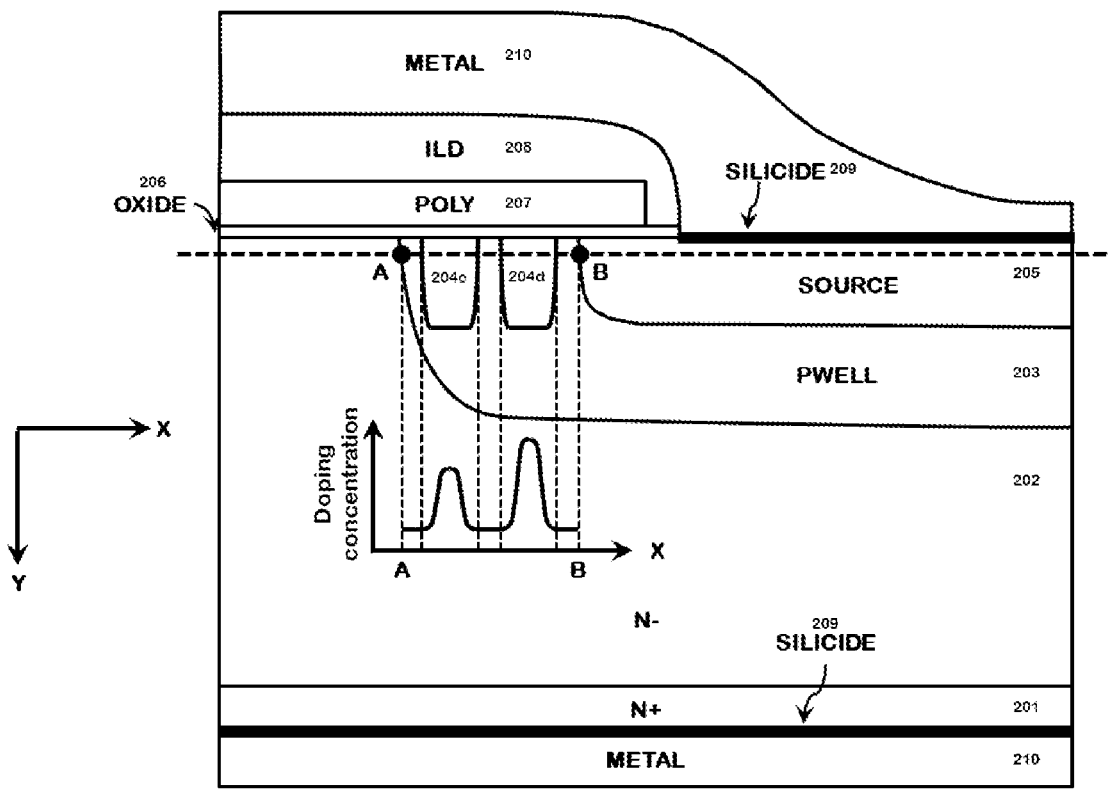
Figure 2D:
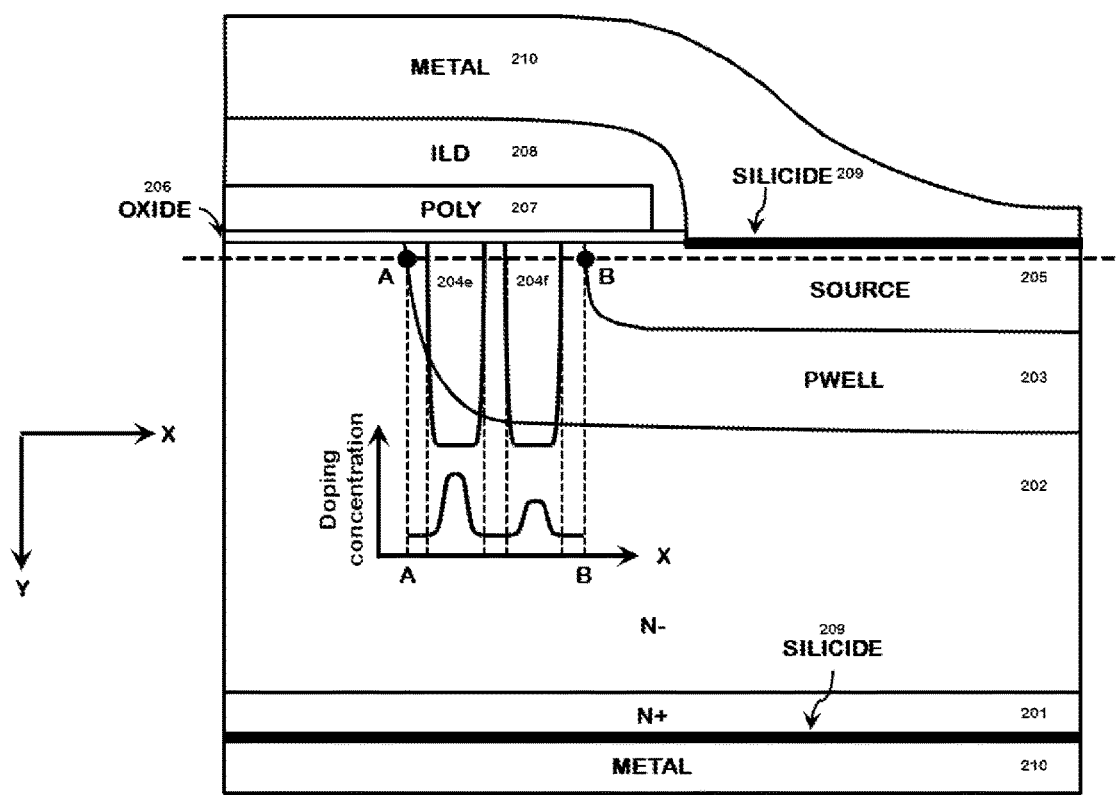

In an embodiment shown in FIG. 2c and FIG. 2d the devices are similar to FIG. 2a. The devices in FIG. 2c and FIG. 2d exemplify the case where there are multiple p-shield regions. In these cases, their doping concentration profiles of the different p-shield regions do not necessarily have be the same and can be different from each other.

In case of biasing the drain with high voltage, the p-shield that is formed in the middle of the channel can help in mitigating the expansion of the drain bias-induced depletion region, which eliminates the DIBL effect. In addition to the mitigation of the DIBL effect, the p-shield region also provides a simple way for controlling the $V_{TH}$ of the MOSFET, which enables improving the short circuit time ($t_{SC}$). The p-shield enables a local increase of the doping concentration of the p-well at critical locations in the device structure, as opposed to an uniform increase of the p-well doping concentration. A better trade-off with respect to lower Vth, ON resistance and better immunity to short-channel effects is obtained by methods described in the embodiment. In the case, where the depth of the p-shield region is greater than the p-well region, i.e. the p-shield extends beyond the p-well region in the vertical direction, the p-shield can also provide better shielding of the electric field to the channel region which further mitigates the DIBL effect in the channel. The device structure with multiple p-shield regions can be designed with different doping concentrations in the different p-shield regions. In an embodiment described herein, a higher doping concentration can be applied to the p-shield region/s close to the edge of the p-well (POINT A), while the p-shield regions closer to POINT B can be made with lower doping concentrations. This structure will have the benefit of a lower gate threshold voltage as well as excellent immunity to short-channel effects, for a given channel length.

Figure 3A:
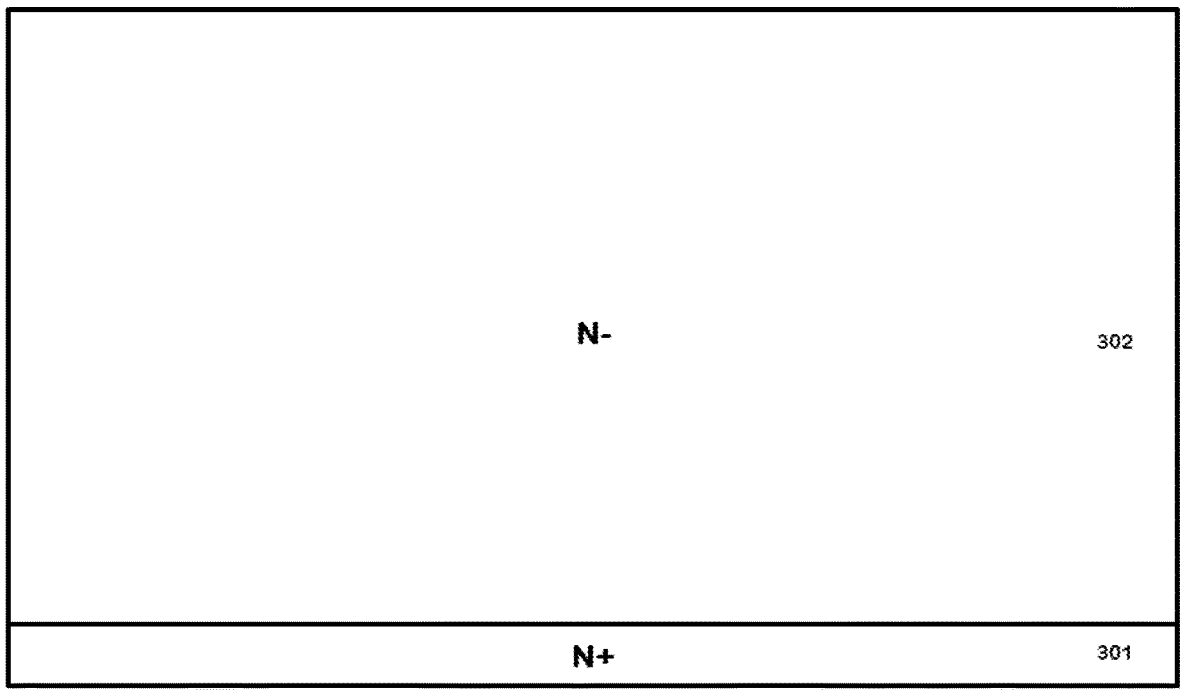
Figure 3B:
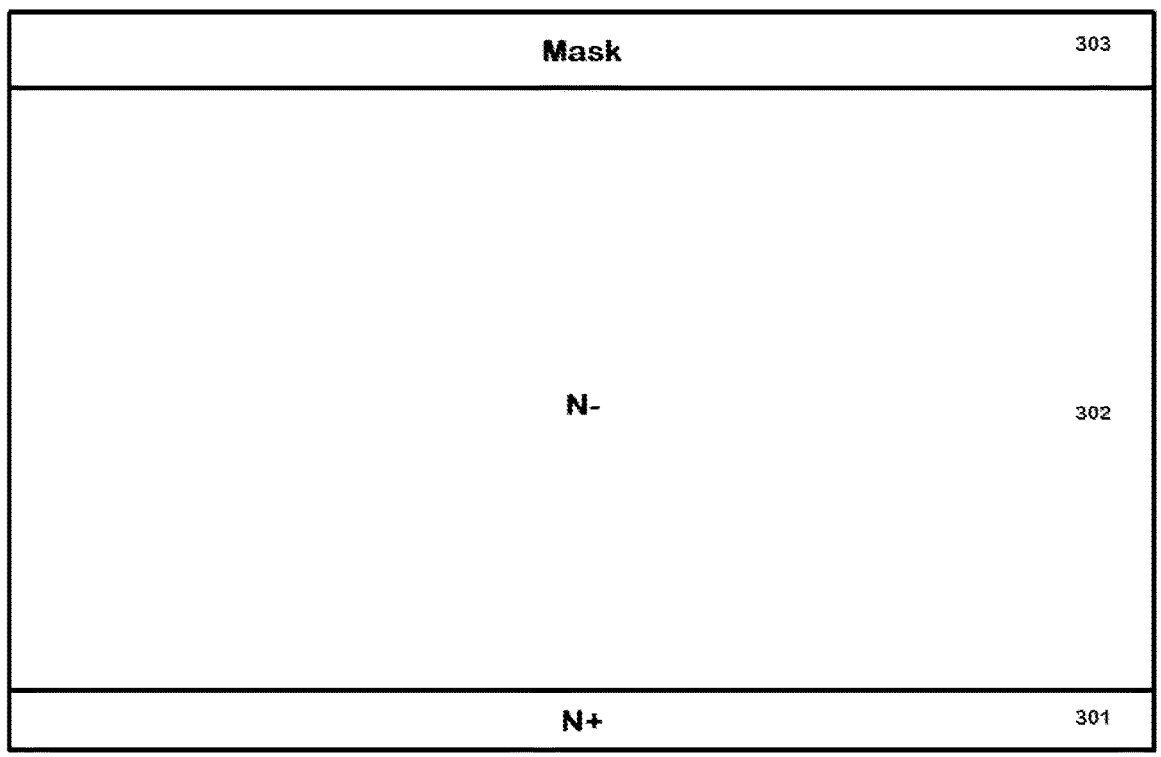
Figure 3C:
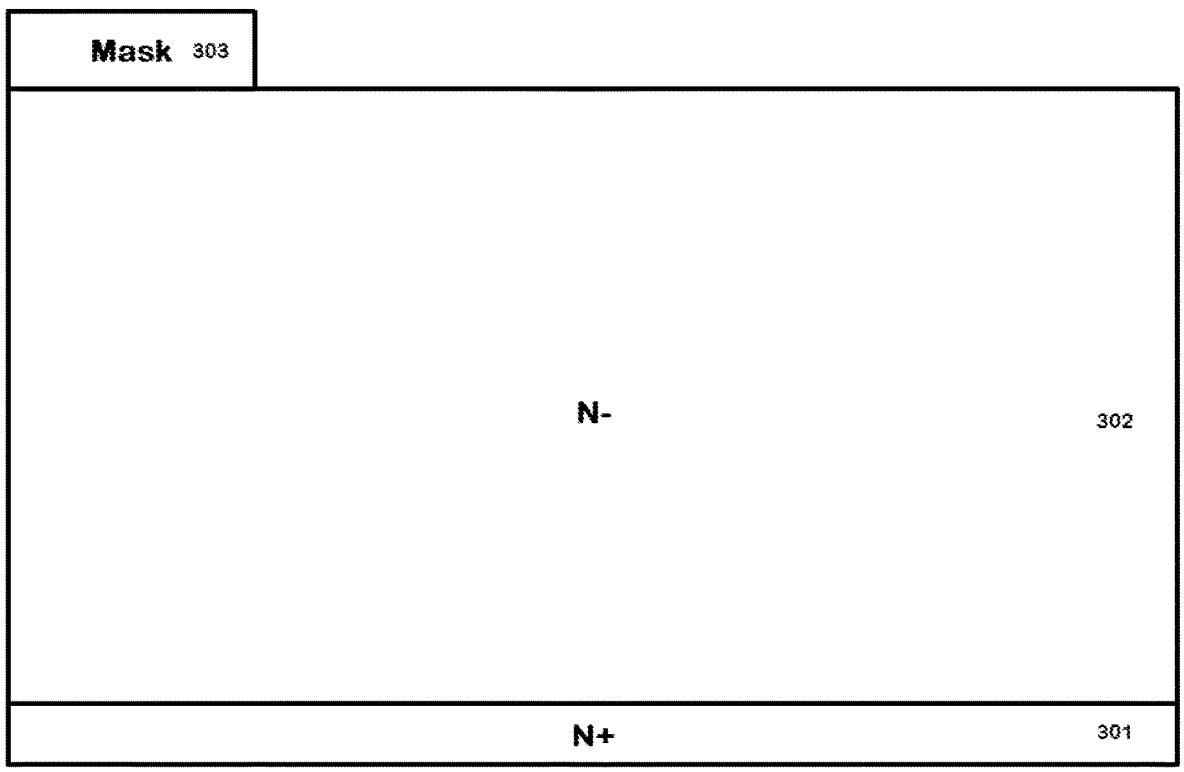
Figure 3D:
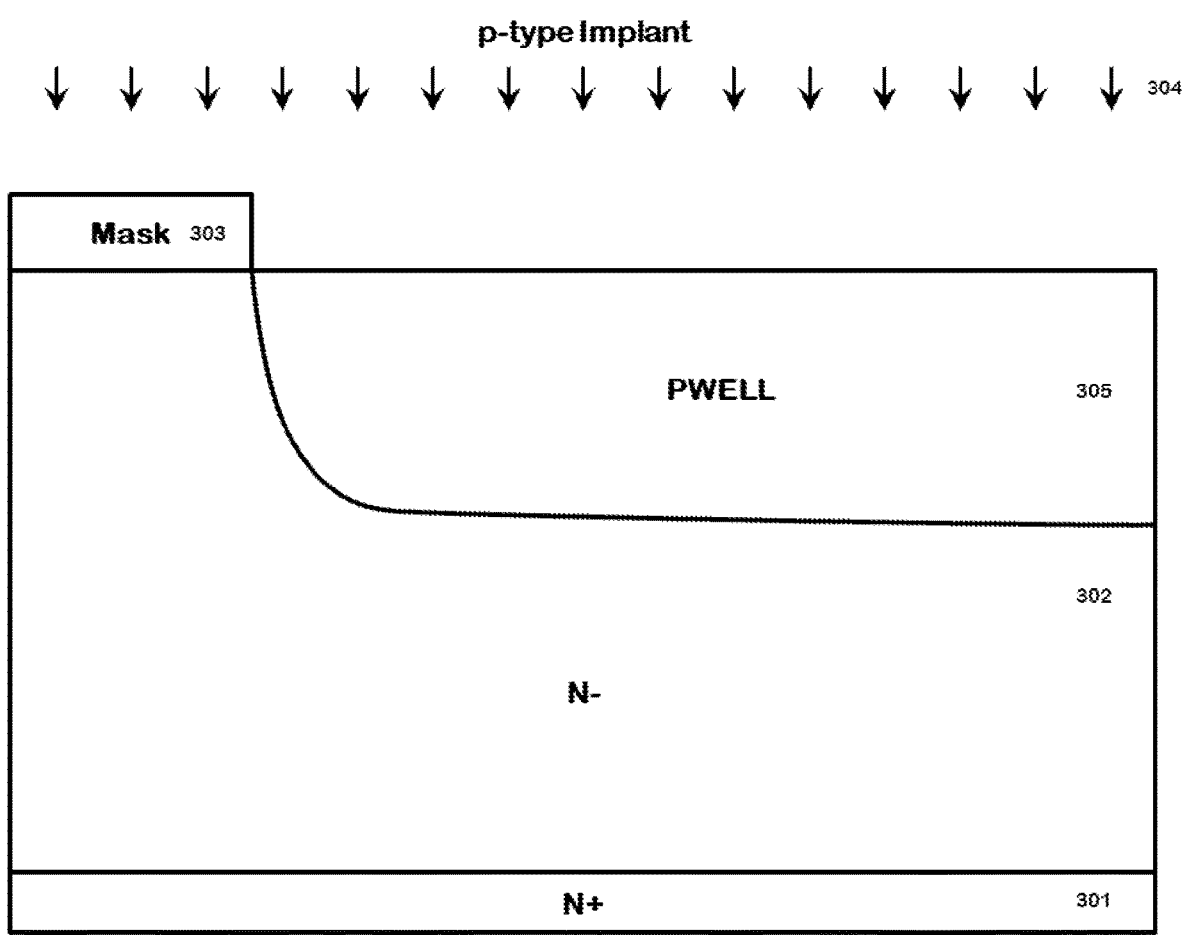
Figure 3E:
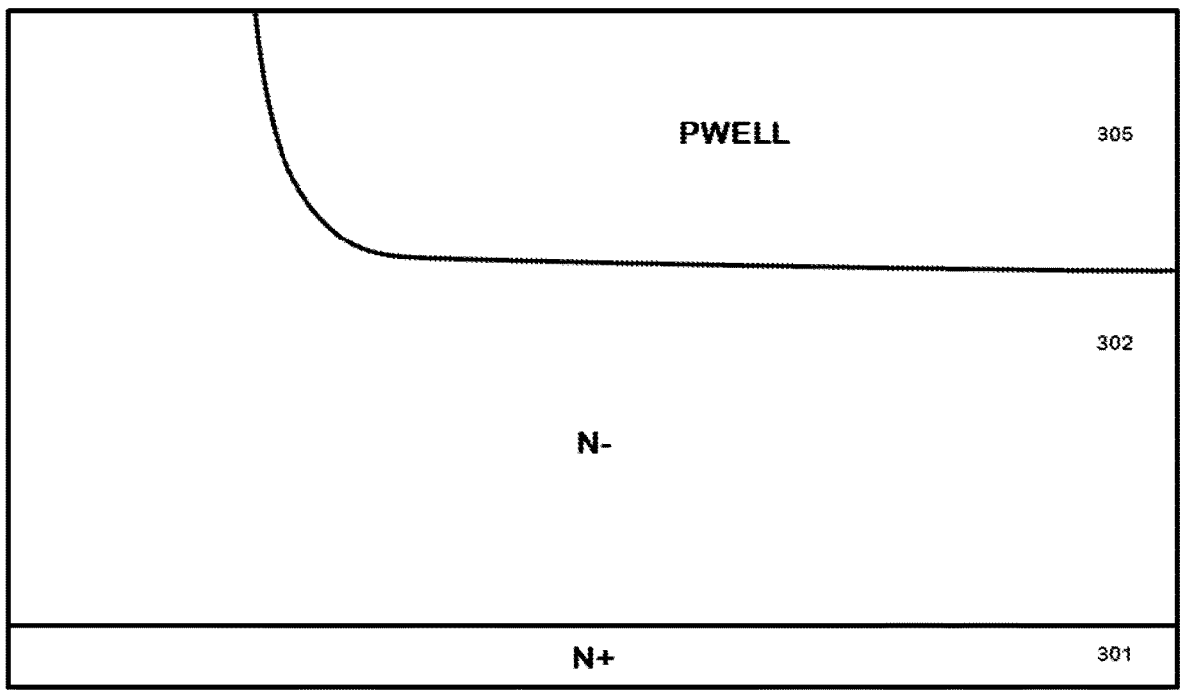
Figure 3F:
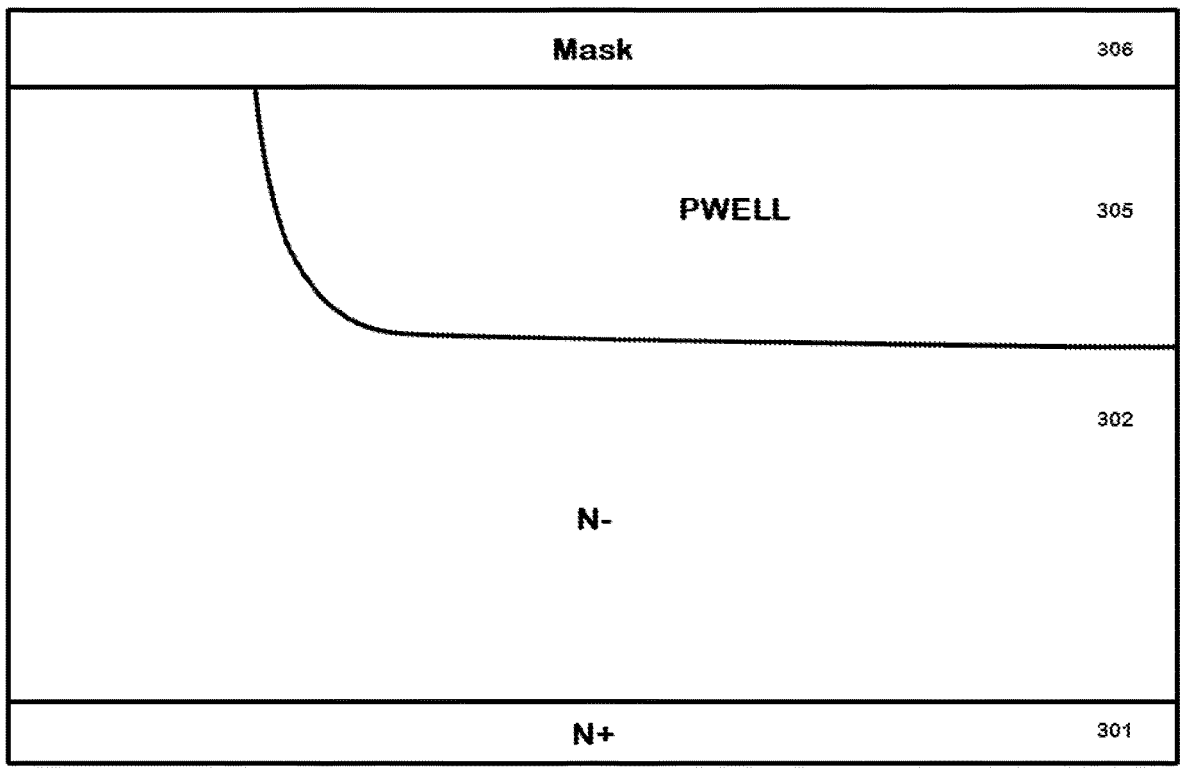
Figure 3G:
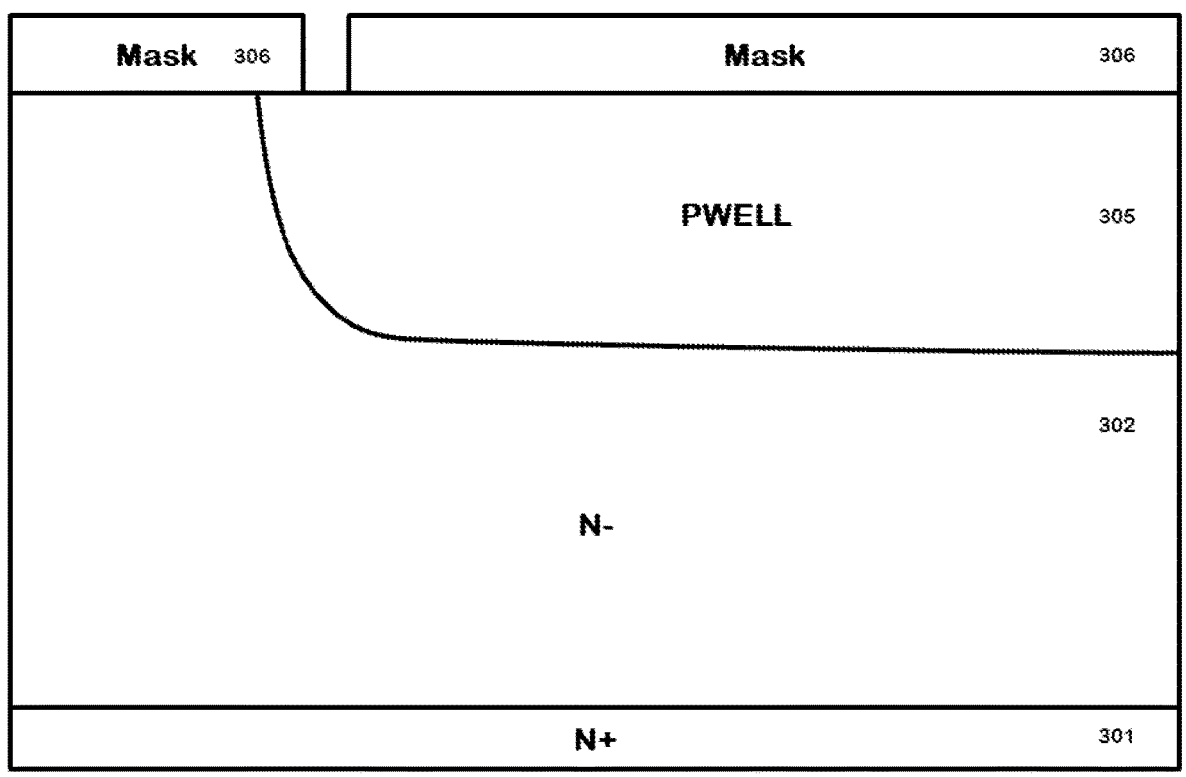
Figure 3H:
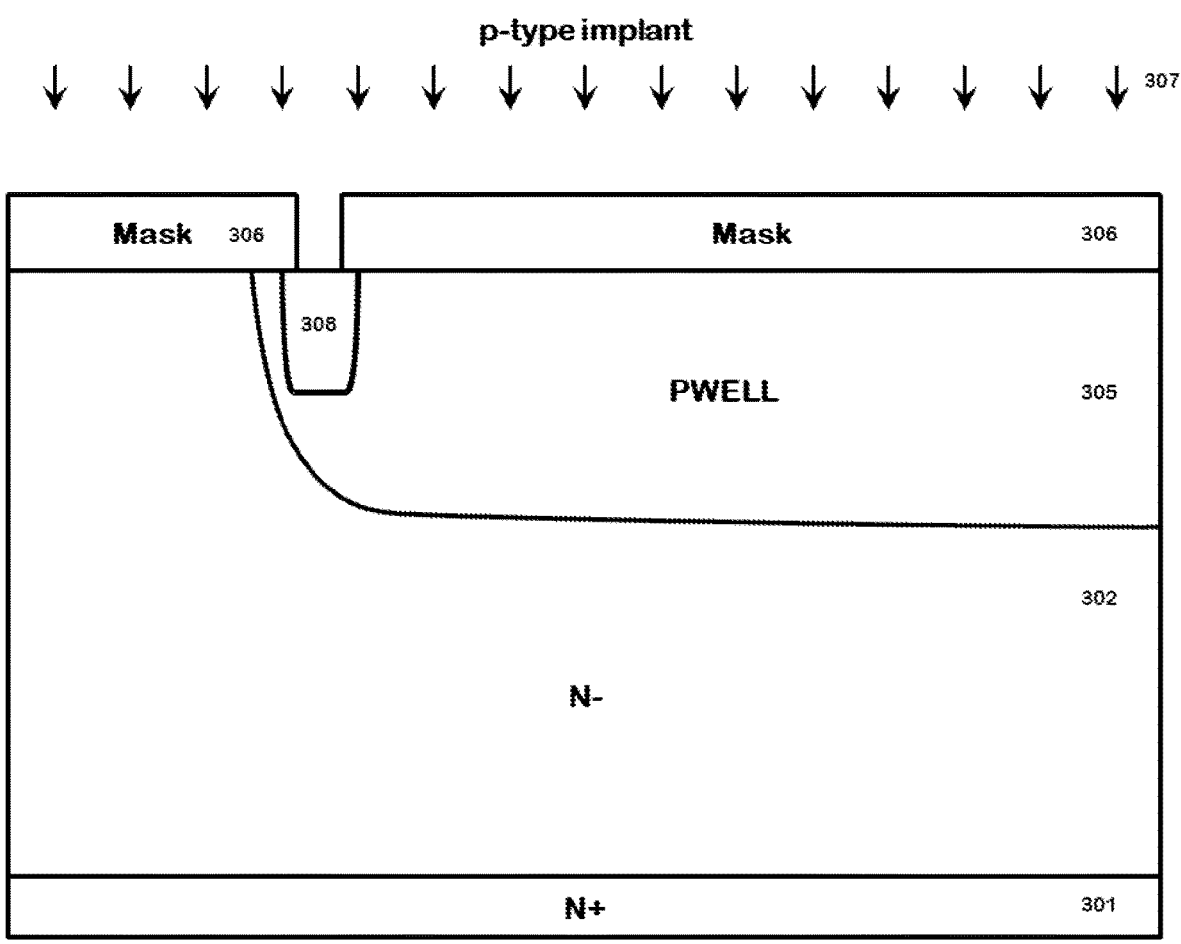
Figure 3I:
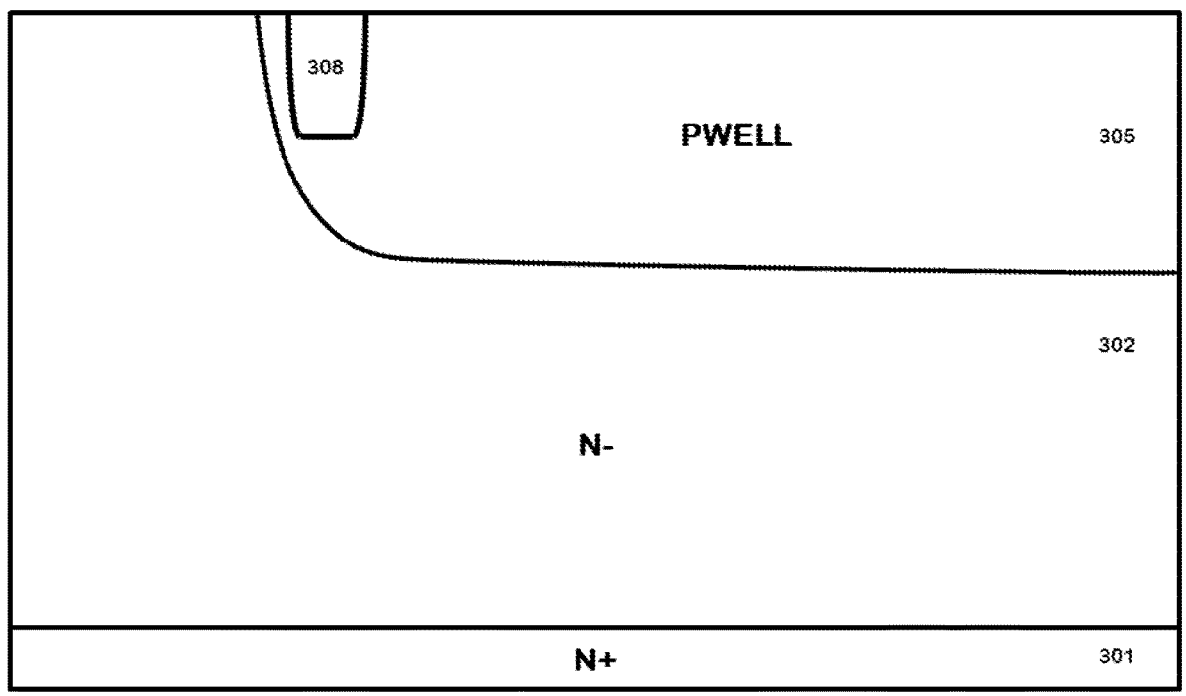
Figure 3J:
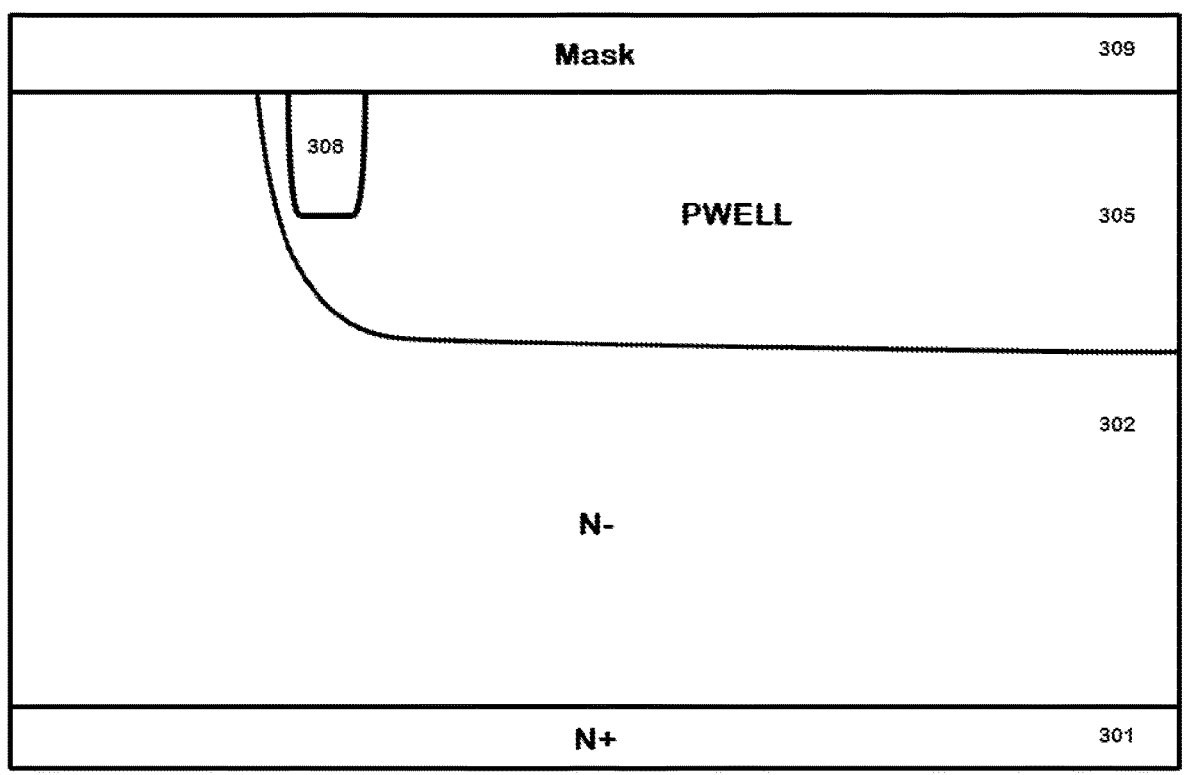
Figure 3K:
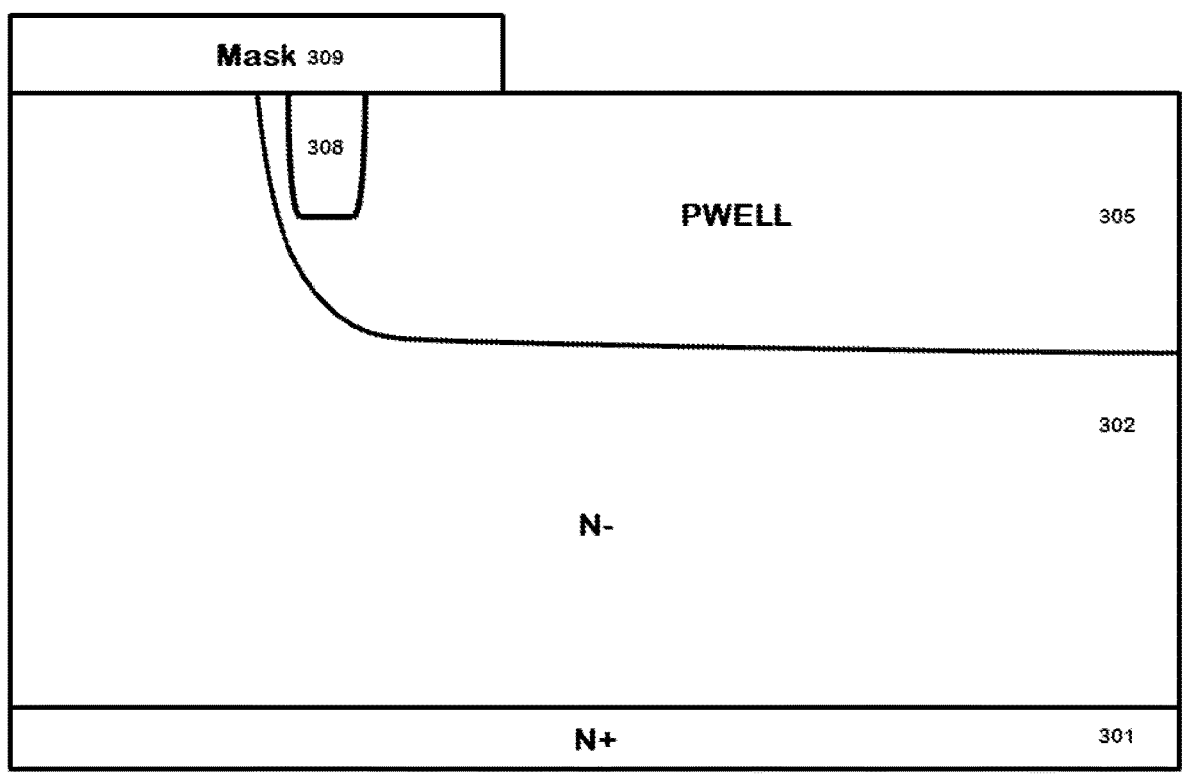
Figure 3I:
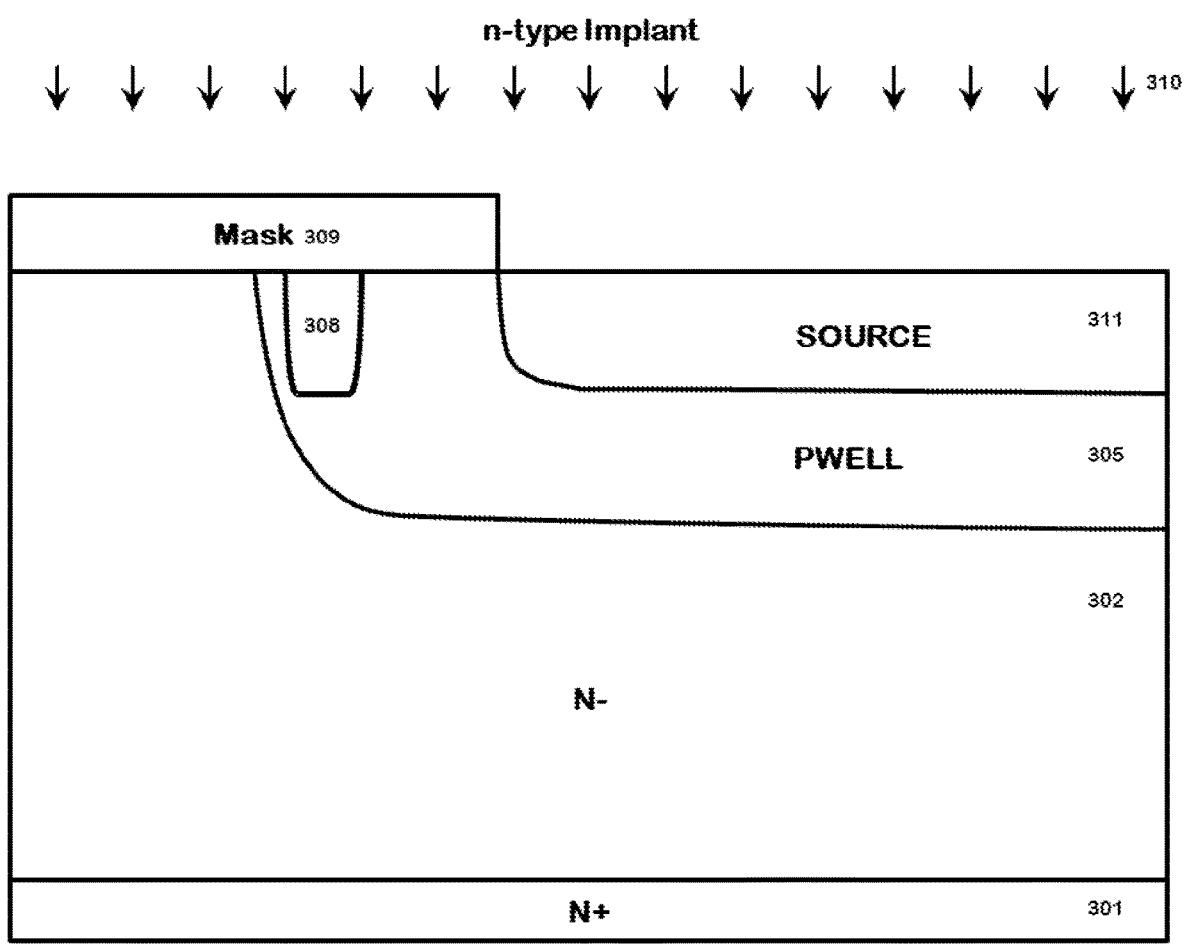
Figure 3M:
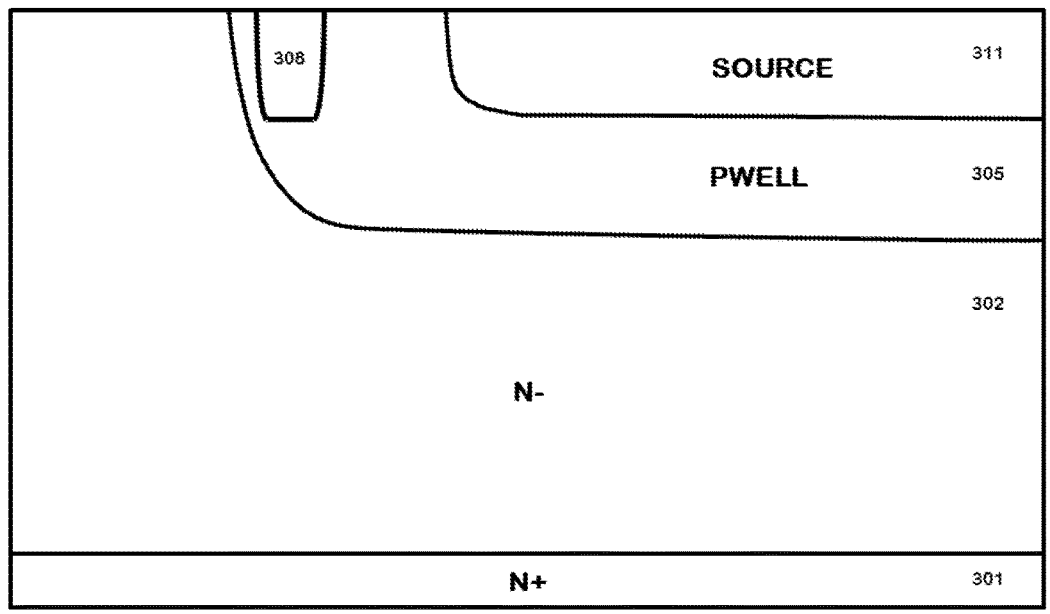
Figure 3N:
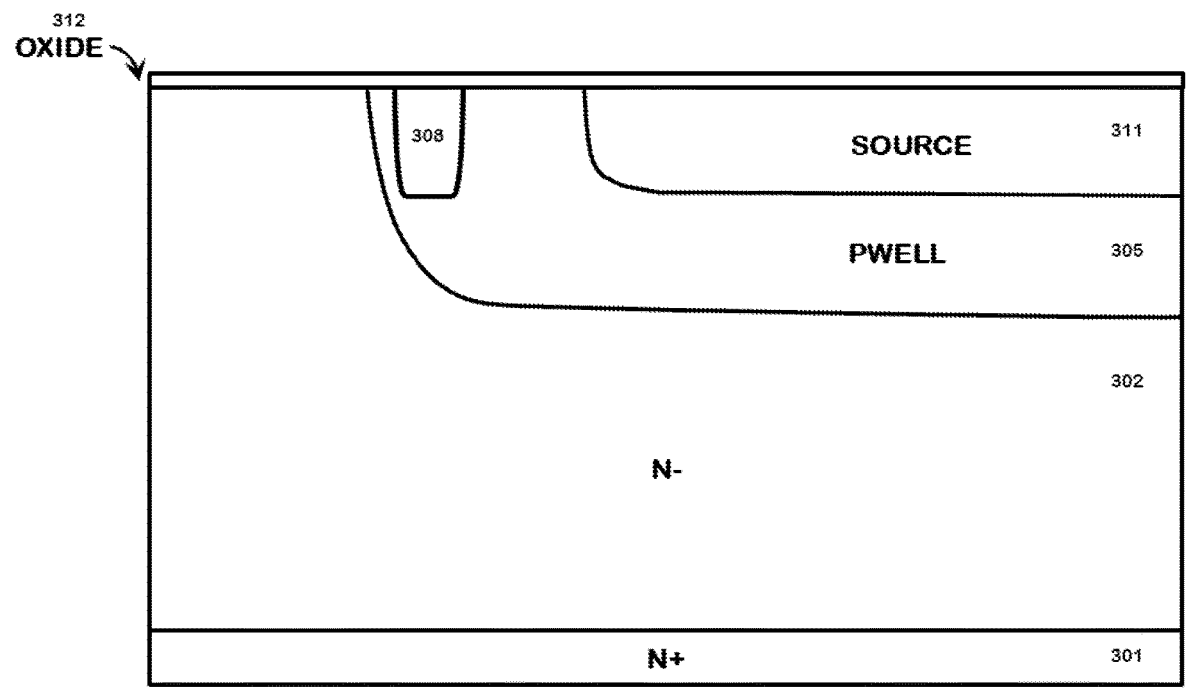
Figure 3O:
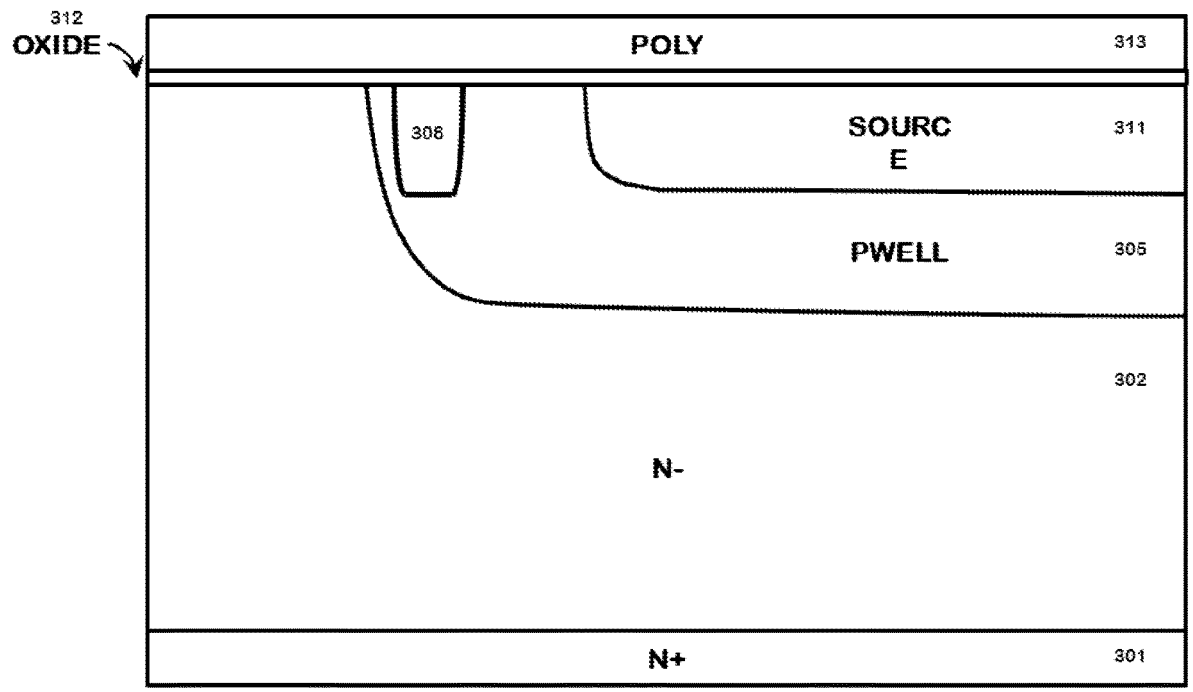
Figure 3P:
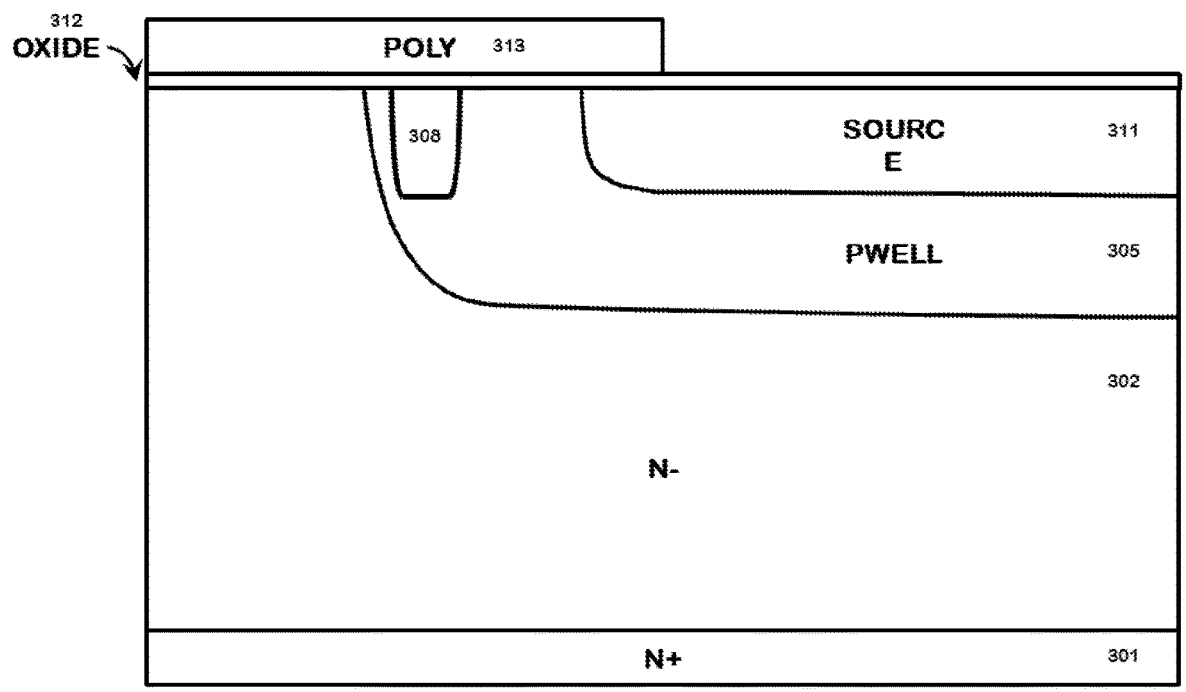
Figure 3Q:
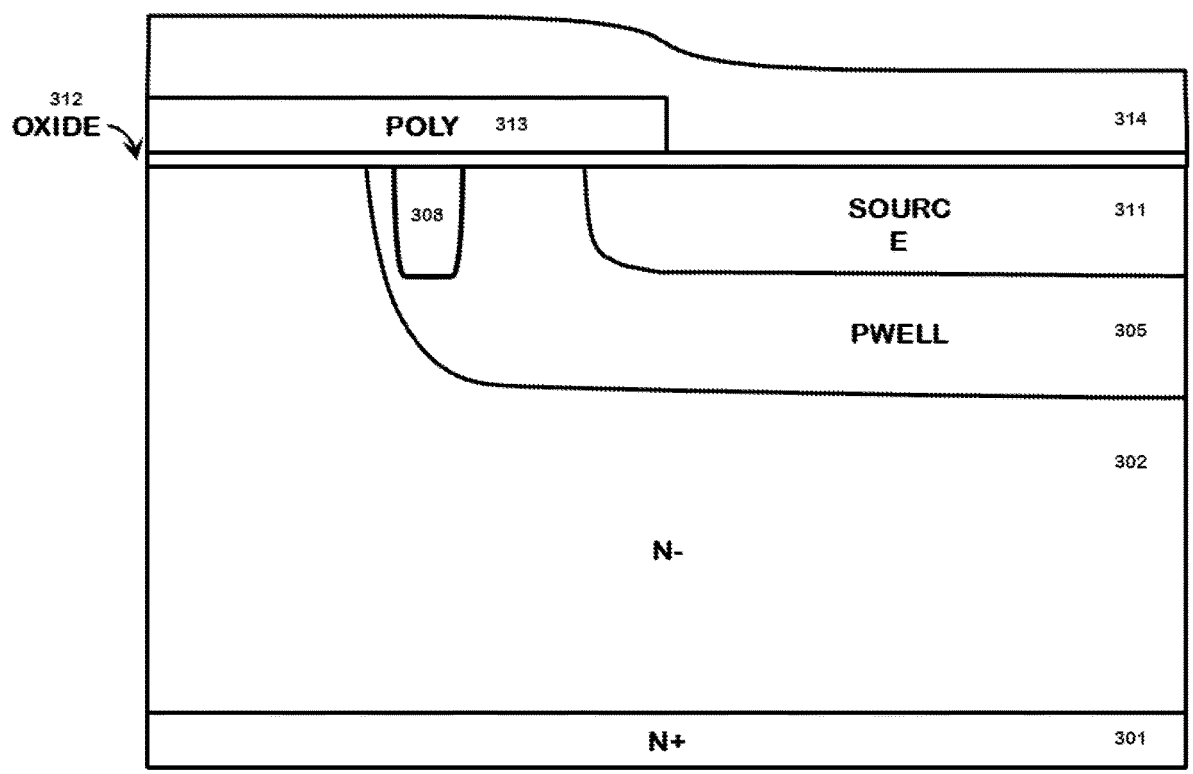
Figure 3R:
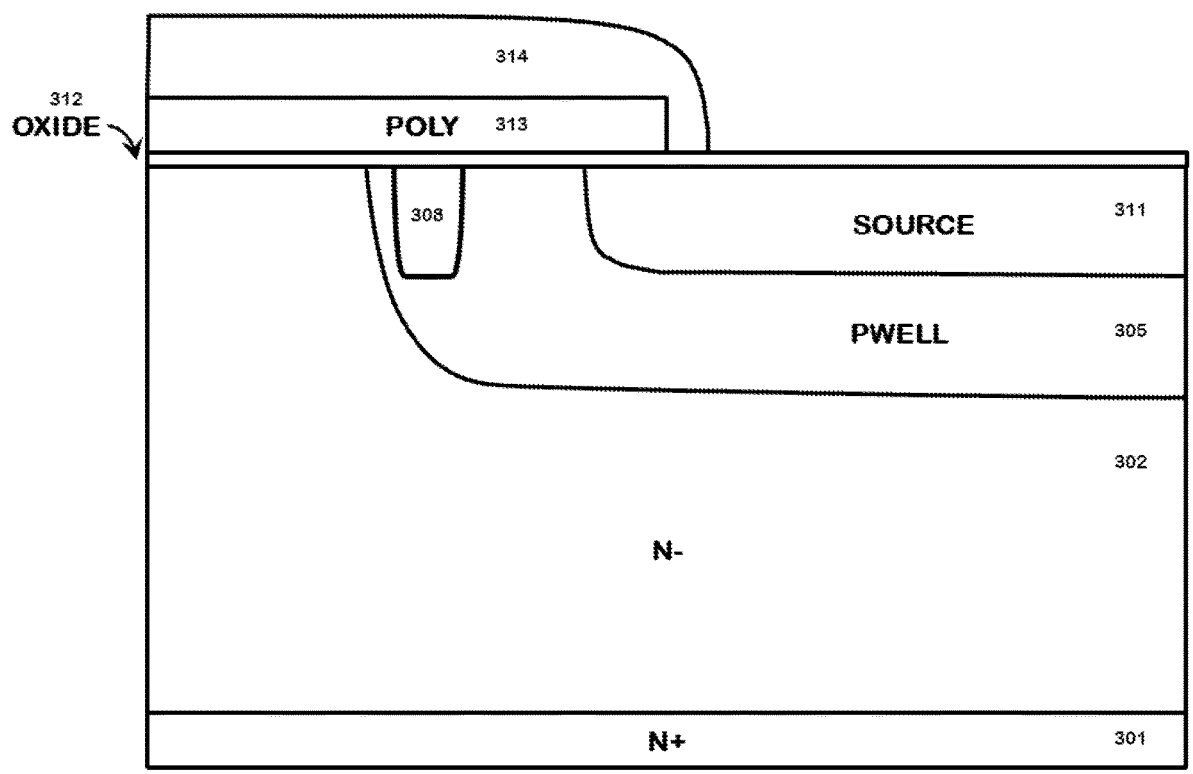
Figure 3S:
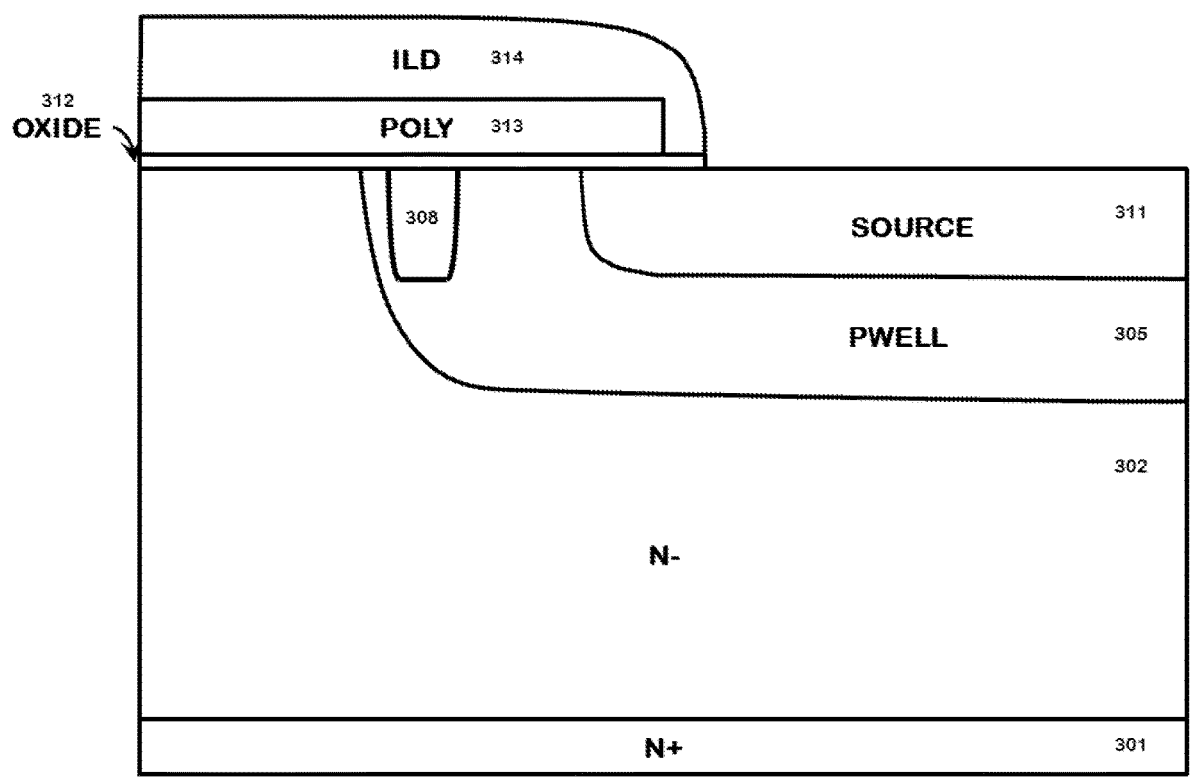
Figure 3T:
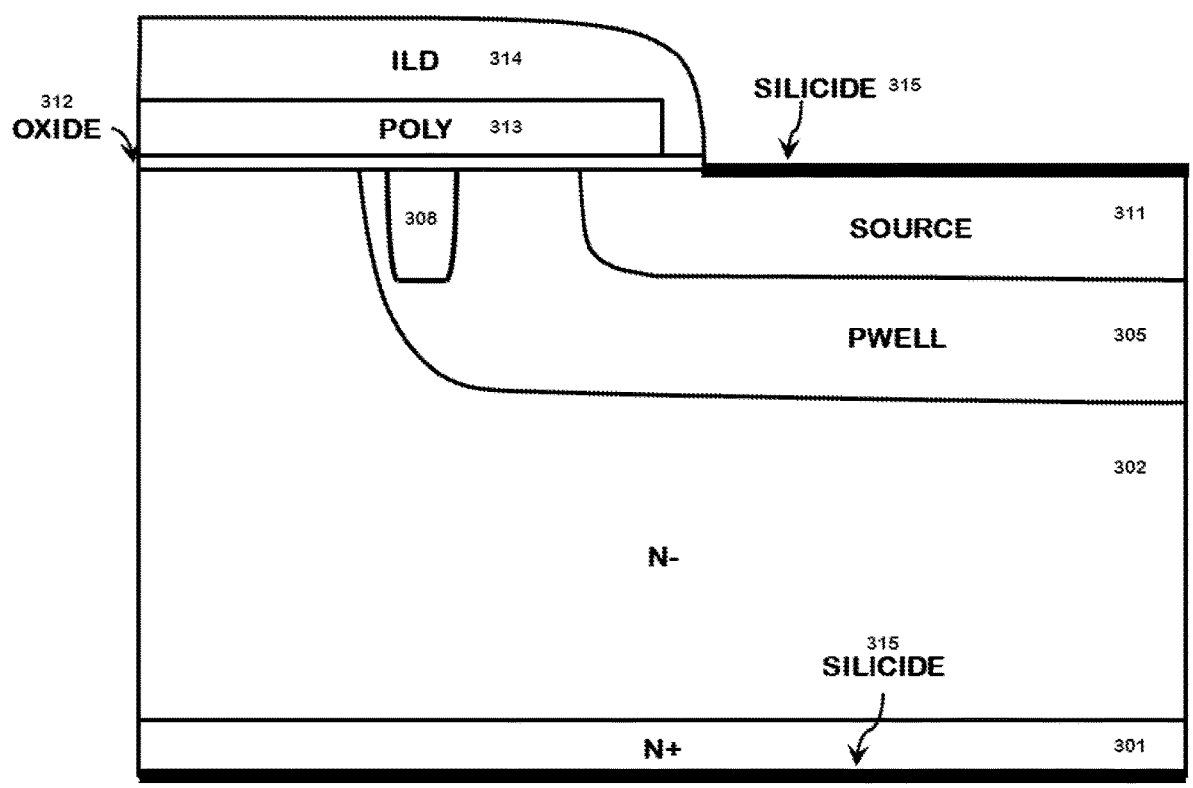
Figure 3U:
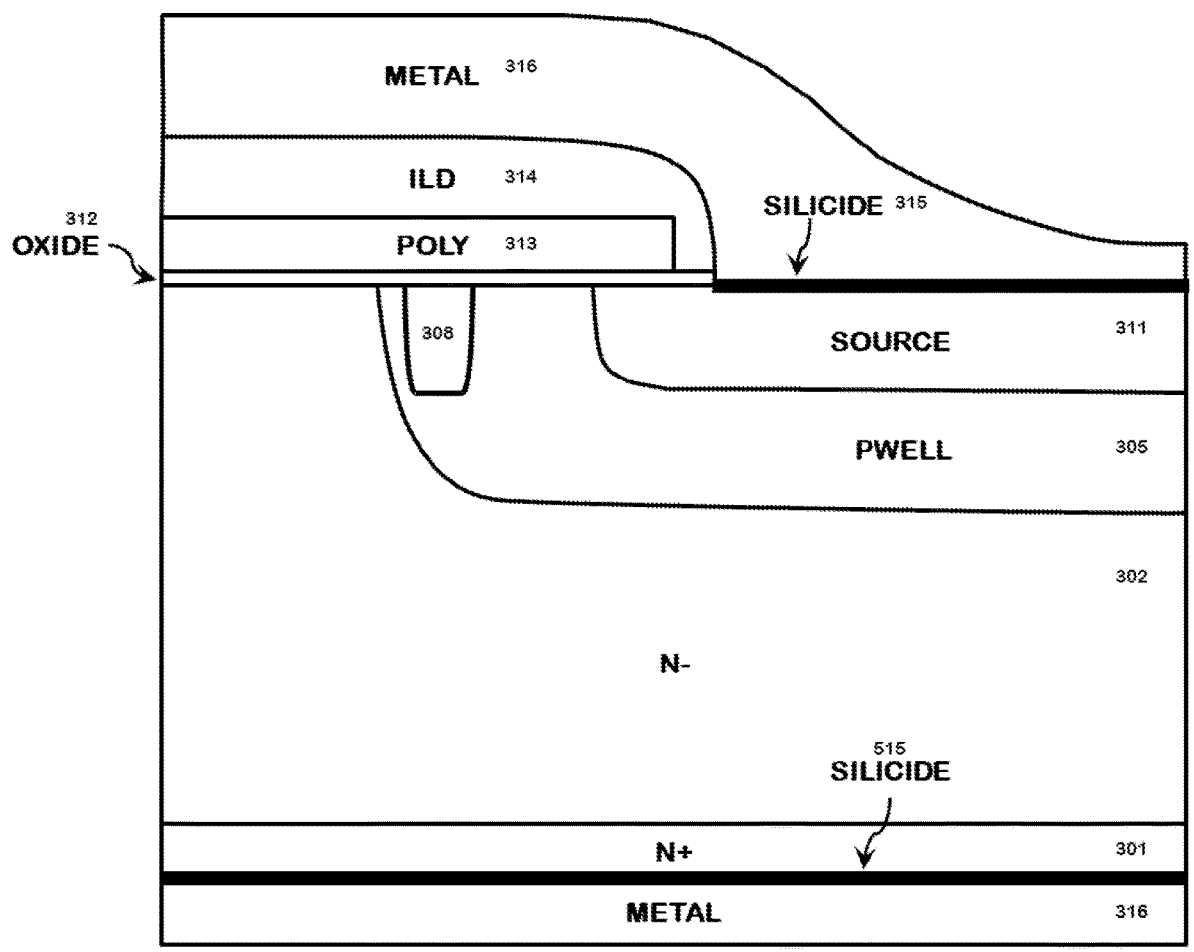

FIG. 3a to FIG. 3u describes the process of manufacturing the structure shown in FIG. 2a. The manufacturing process for a SiC DMOSFET is on a SiC substrate 301 and starts with using a 4H-SiC Si-face epi-wafer with suitable doping ($10^{14}$-$10^{18}$ cm$^{-3}$) and thickness (1 μm to 300 μm) for the epilayer 302 shown in FIG. 3a. A blanket hard mask 303 comprising a chemical vapor deposition (CVD) deposited layer of silicon dioxide, silicon nitride, silicon oxynitride, or a metallic layer such as nickel, with thickness ranging from 50 nm to 5 μm is deposited in FIG. 3b and then patterned using photolithography followed by a dry etch using reactive ion etching (RIE) for example as shown in FIG. 3c. The p-well region is first formed by ion-implantation or epitaxial growth using aluminum or boron as the p-type impurity. A p-type implantation 304 comprising boron or aluminum, at energies ranging from 10 keV to 1000 keV, at implant doses ranging from $10^{12}$ cm$^{-2}$ to $10^{15}$ cm$^{-2}$ is performed to create a p-well 305 in FIG. 3d. The patterned mask layer 303 is removed in FIG. 3e.

A hard mask layer 306 is deposited by a CVD deposited layer of silicon dioxide, silicon nitride, silicon oxynitride, or a metallic layer such as nickel, with thickness ranging from 50 nm to 5 μm in FIG. 3f. The mask layer 306 is patterned using photolithography followed by a dry etch using RIE for example in FIG. 3g.

A p-type implant 307 is done as shown in FIG. 3h for creating a p-type region inside the p-well called p-shield 308. The p-shield region 308 can be formed using aluminum or boron as the p-type impurity. The doping concentration in the p-shield region may be in the range of 1E16 cm-3 to 1E21 cm-3. The patterned mask layer 306 is removed in FIG. 3i.

A blanket hard mask 309 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 3j and then patterned using photolithography followed by a dry etch using RIE for example as shown in FIG. 3k.

A N+ source region 311 is formed by ion-implantation or by epitaxial re-growth by a n-type impurity such as nitrogen or phosphorus 310 in FIG. 3l. The patterned mask layer 309 is removed in FIG. 3m.

The oxide layer 312 which is the gate oxide is formed by thermal oxidation or using CVD of a dielectric layer such as silicon dioxide, silicon nitride, silicon oxynitride, etc. in FIG. 3n. The thickness of the gate oxide could range from 10 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer 313 is then deposited in FIG. 3o. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl₃ followed by a drive-in step at temperatures ranging from 700-900° C. The polysilicon layer 313 is patterned in FIG. 3p. An ILD layer 314 comprising 50 nm-1000 nm thick silicon dioxide, silicon nitride, silicon oxynitride layers or a stacked combination thereof is deposited on the wafer in FIG. 3q. The ILD layer 314 is patterned in FIG. 3r. The gate oxide 312 is patterned in FIG. 3s.

Nickel silicide regions 315 are formed on the exposed SiC surface in FIG. 3t. Interconnect metal layers 316 of either aluminum or silver or gold is deposited and patterned on the top and bottom of the substrate in. FIG. 3u.

Figure 4A:
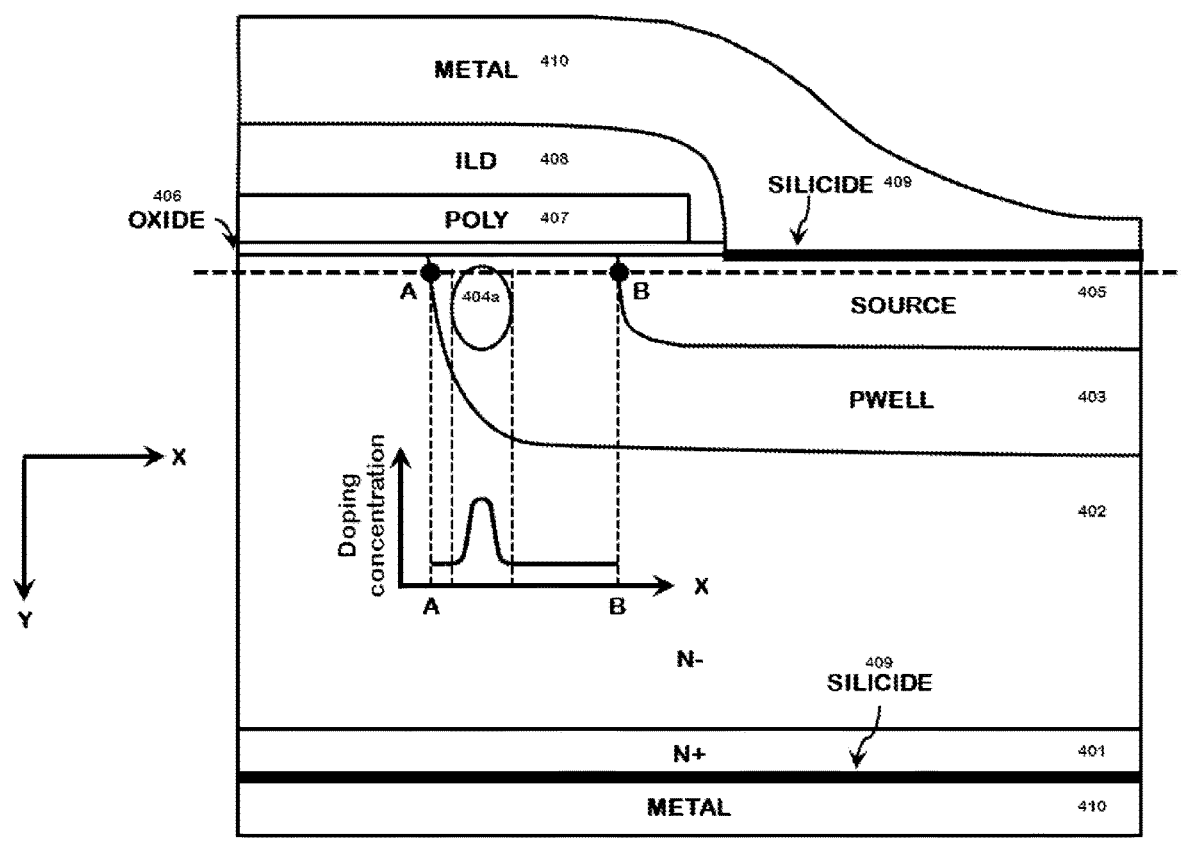
FIG. 4a to FIG. 4d show embodiments of a SiC DMOS-FET structure for field shielding formed buried within the p-well structure.

An embodiment shown in FIG. 4a is the half unit cell of a cross-sectional structure of a SiC DMOSFET. The key regions of this device are a p-well region 403, which is formed by ion-implantation or epitaxial re-growth of a p-type species such as aluminum or boron. There is an N+ source region 405, N− drift layer 402, and an N+ substrate 401. In the ON state when a gate voltage is applied to the polysilicon gate 407 the current flows vertically from the drain 401, through the inversion layer which is formed at the top of the p-well layer 403, through the N+ source region 405, and out through the source metallization 410. In the OFF state or the blocking state, a voltage is supported across the p-well 403, N− drift layer 402 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the junction gate field-effect transistor region (JFET region) or the JFET gap and the thickness of the gate oxide 406. Another feature is an ILD layer 408 which is used to insulate the source interconnect metallization 410 from the polysilicon gate 407.

A p-shield region 404a is formed buried within the p-well structure. In other words, the p-shield is formed beneath the SiC surface, where the MOSFET channel is located. The p-shield region always originates within the p-well region as seen in FIG. 4a, but may in certain examples of this embodiment extend beyond the vertical extent of the p-well region as shown in FIG. 4b.

Figure 4B:
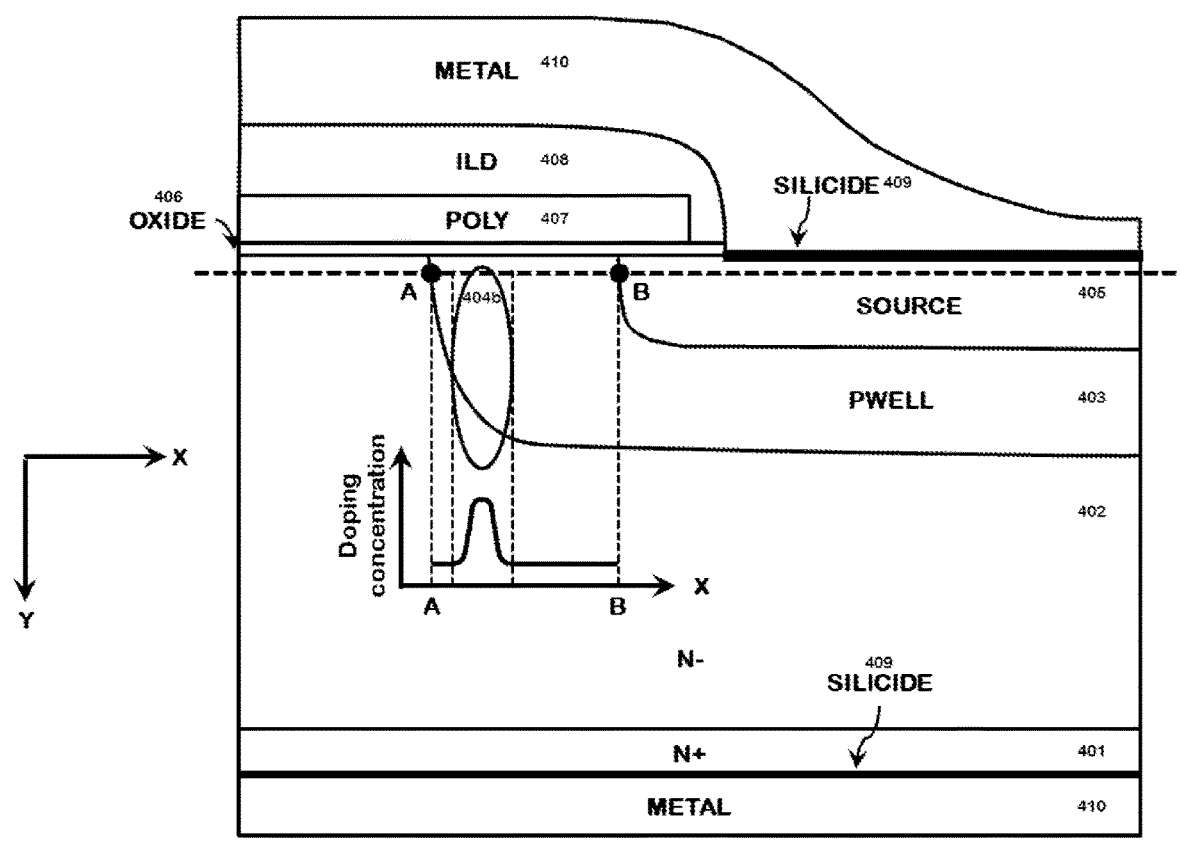

The embodiment shown in FIG. 4b is similar to that of FIG. 4a except that the bottom of the p-shield region is extended further down into the p-well and can reach outside the p-well region.

Figure 4C:
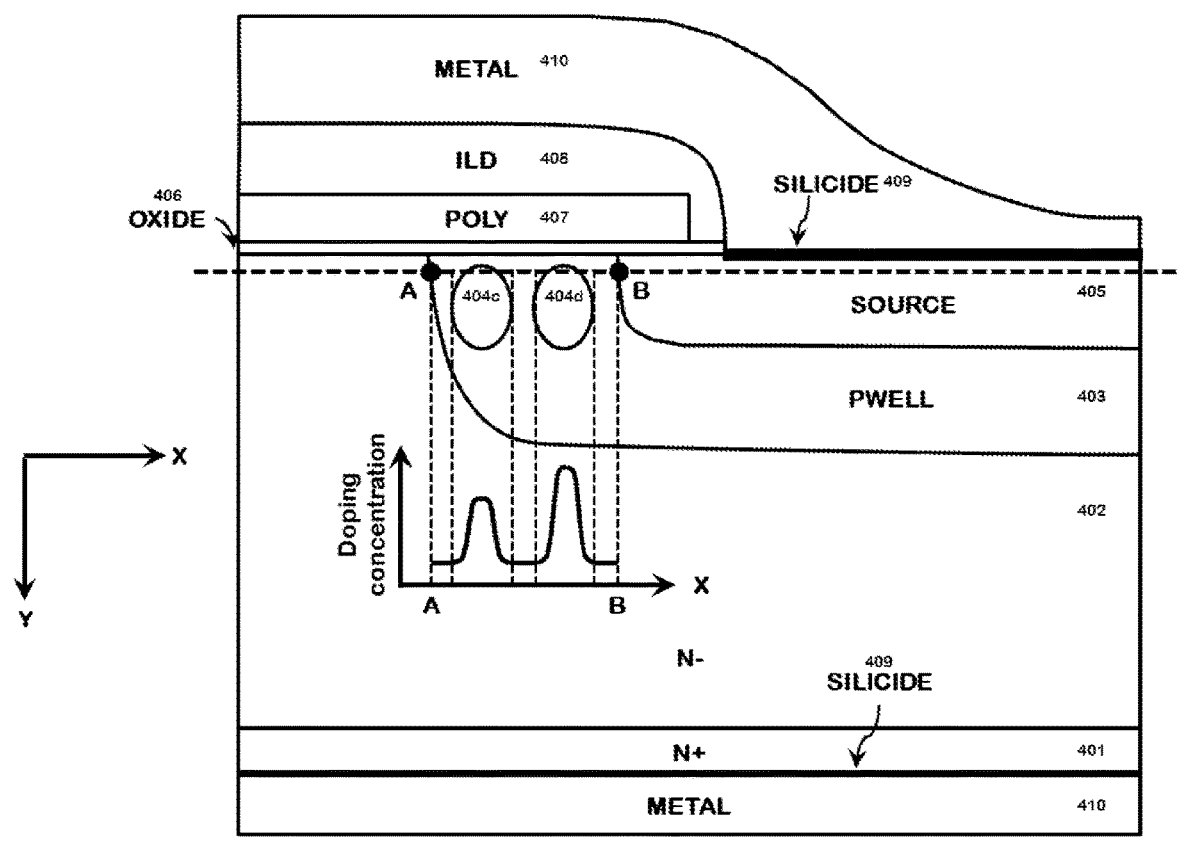
Figure 4D:
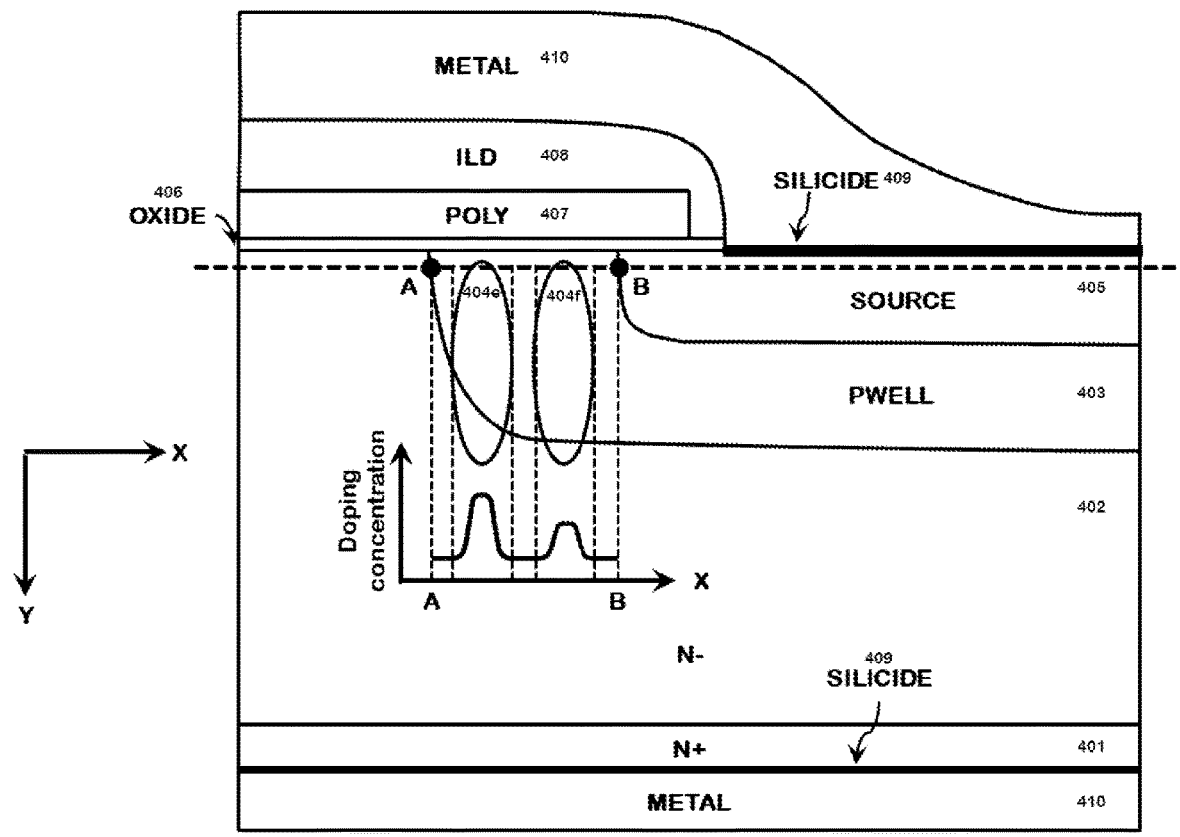

Device structures shown in FIG. 4c and FIG. 4d are also similar to the device in FIG. 4a but they exemplify the case where there are multiple p-shield regions. In these cases, their doping concentration profiles of the different p-shield regions do not necessarily have be the same and can be different from each other. Point A and B in each of these figures are given as the reference points for describing how the doping profile of the implanted p-shield region looks like.

The p-shield in FIG. 4a to FIG. 4d "re-enforces" the doping of the p-well region locally and provides better shielding of the MOSFET channel at the surface, while minimizing the DIBL effect. Since the p-shield is not directly connected to the channel, the p-shield in this case does not change the threshold voltage. The device shown in FIG. 4a provides the same kind of field shielding for mitigating the DIBL but does not require the change of the threshold voltage value where it is inevitable for the device of FIG. 2a.

Figure 5A:
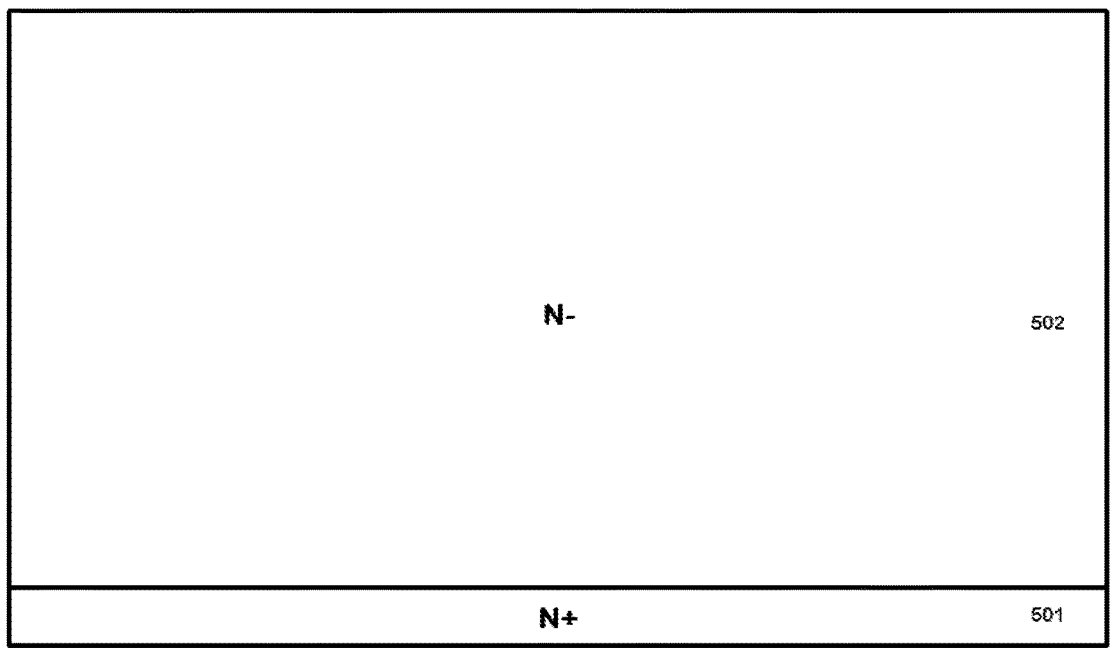
Figure 5B:
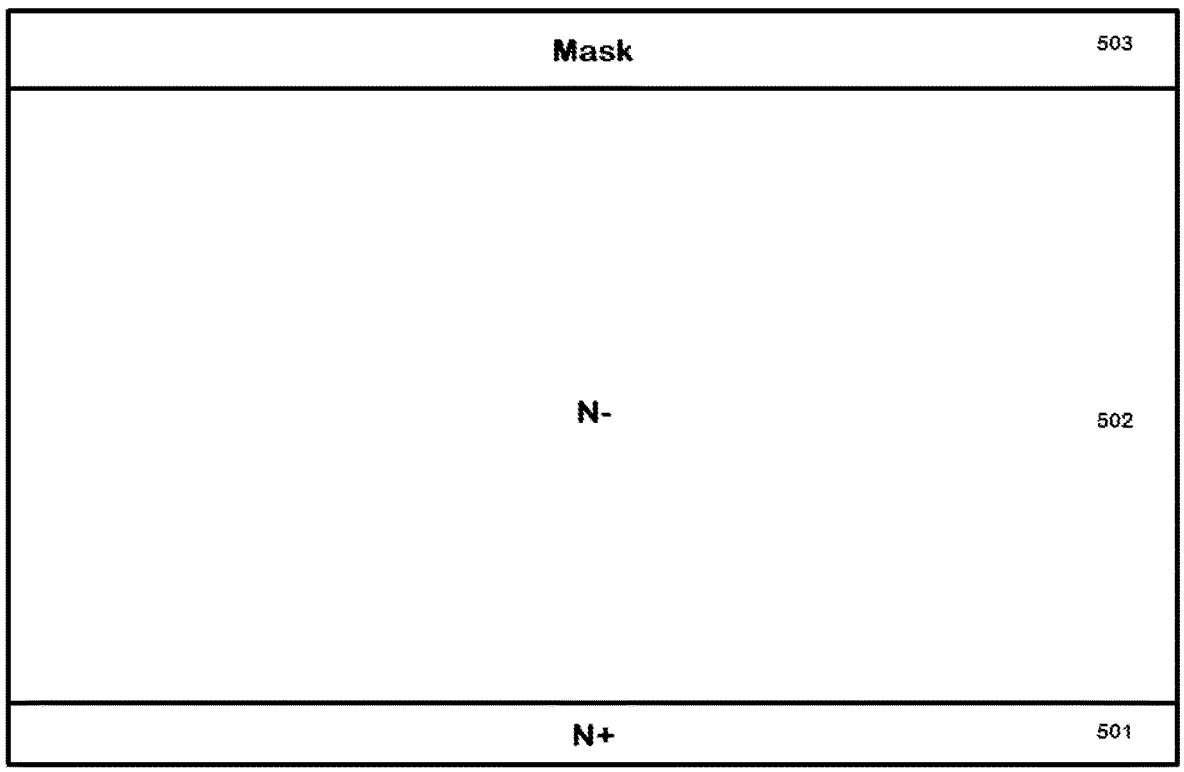
Figure 5C:
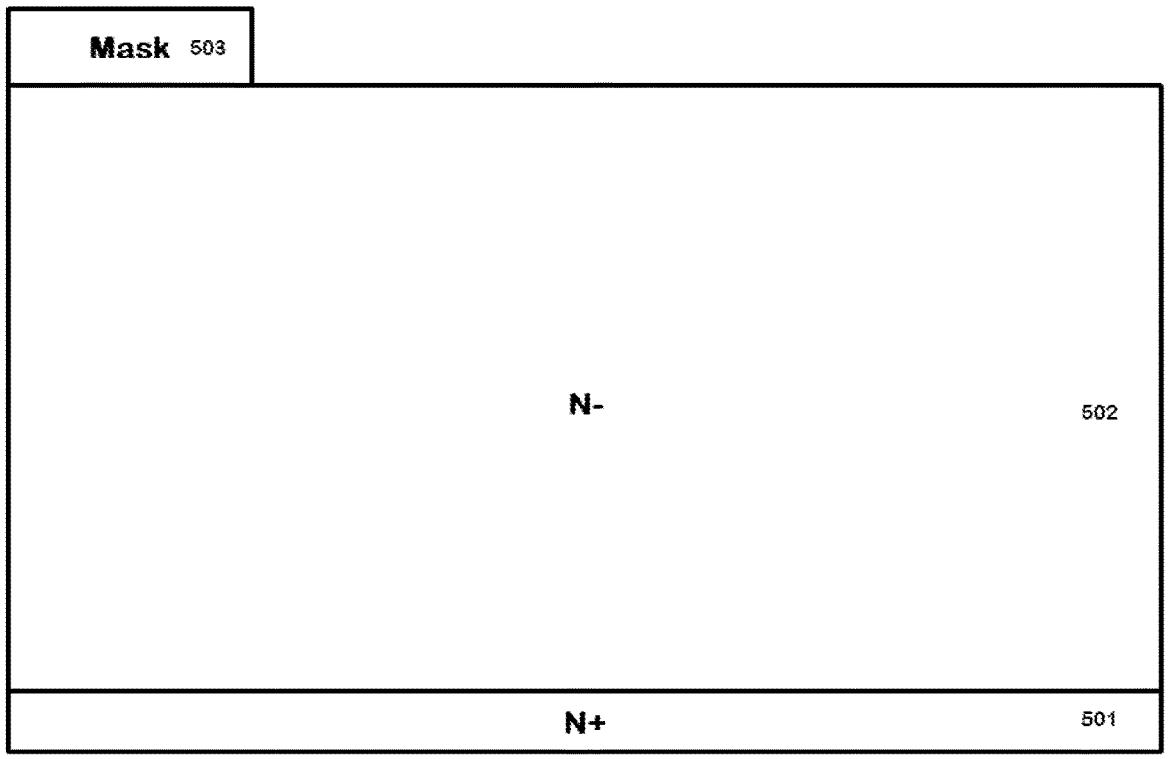
Figure 5D:
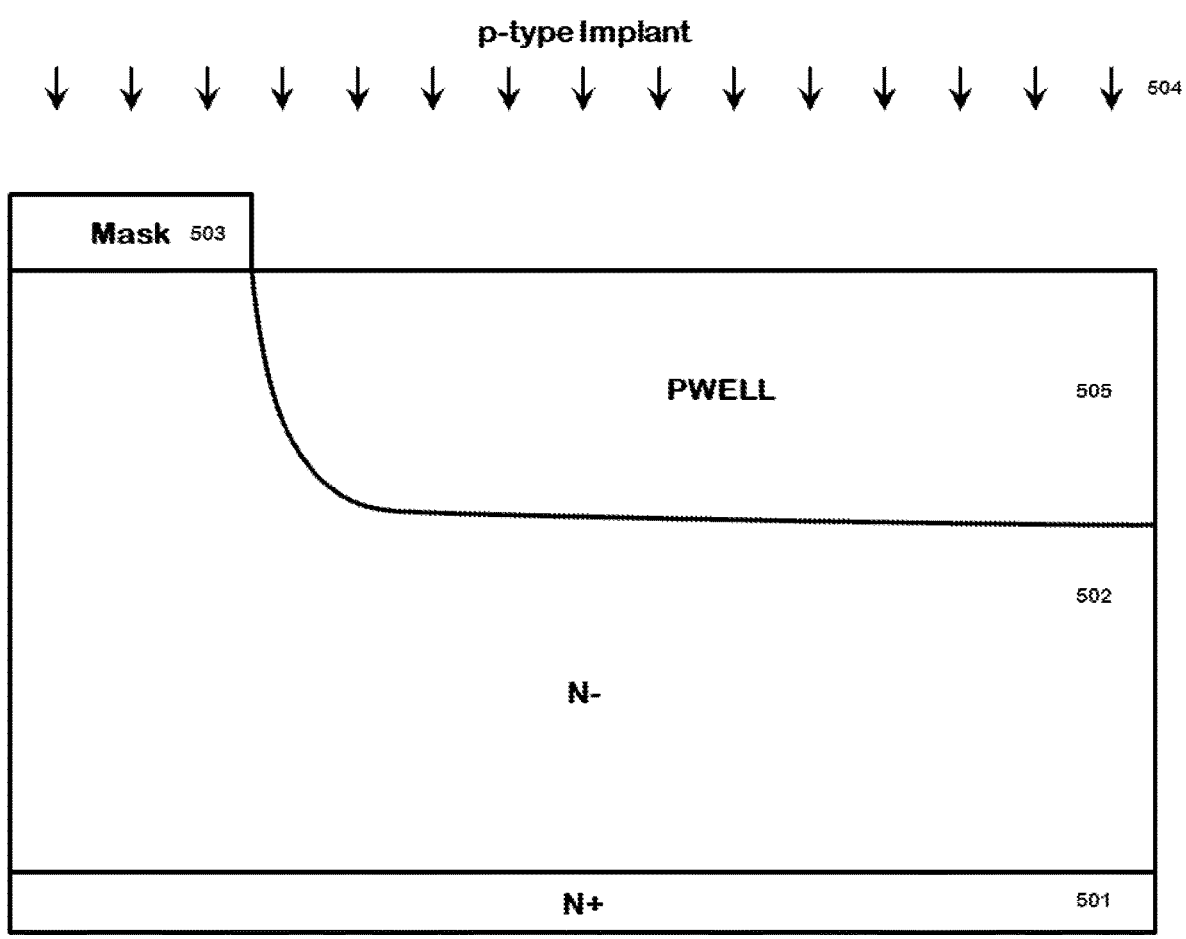
Figure 5E:
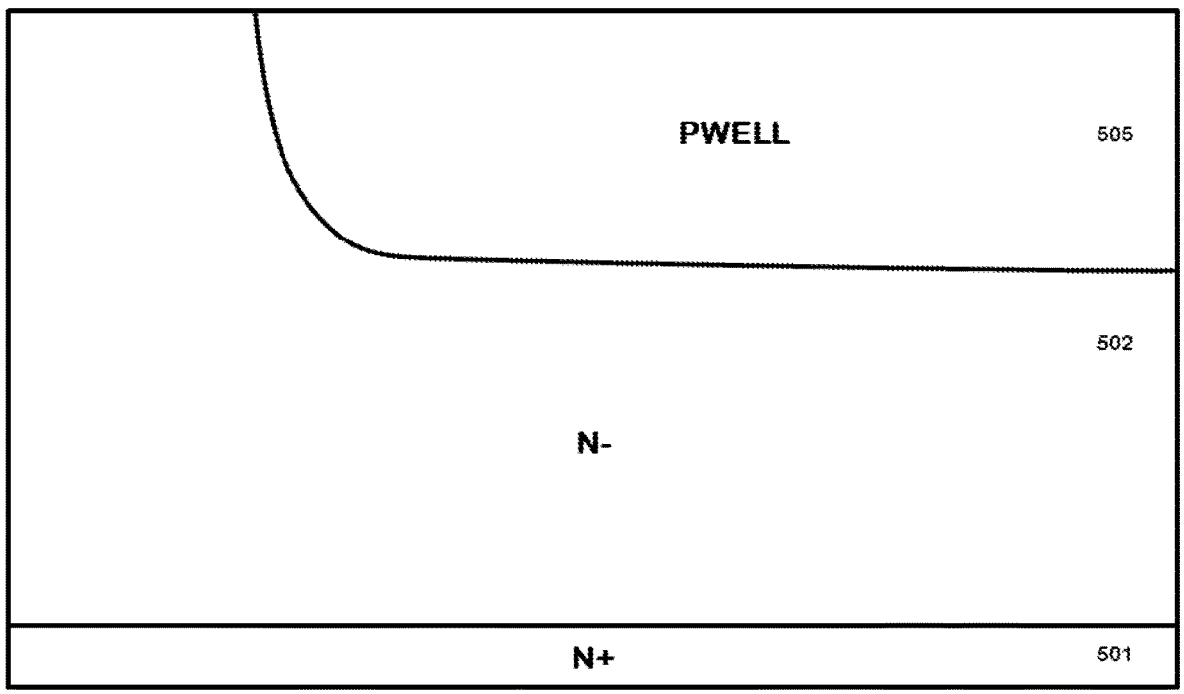
Figure 5F:
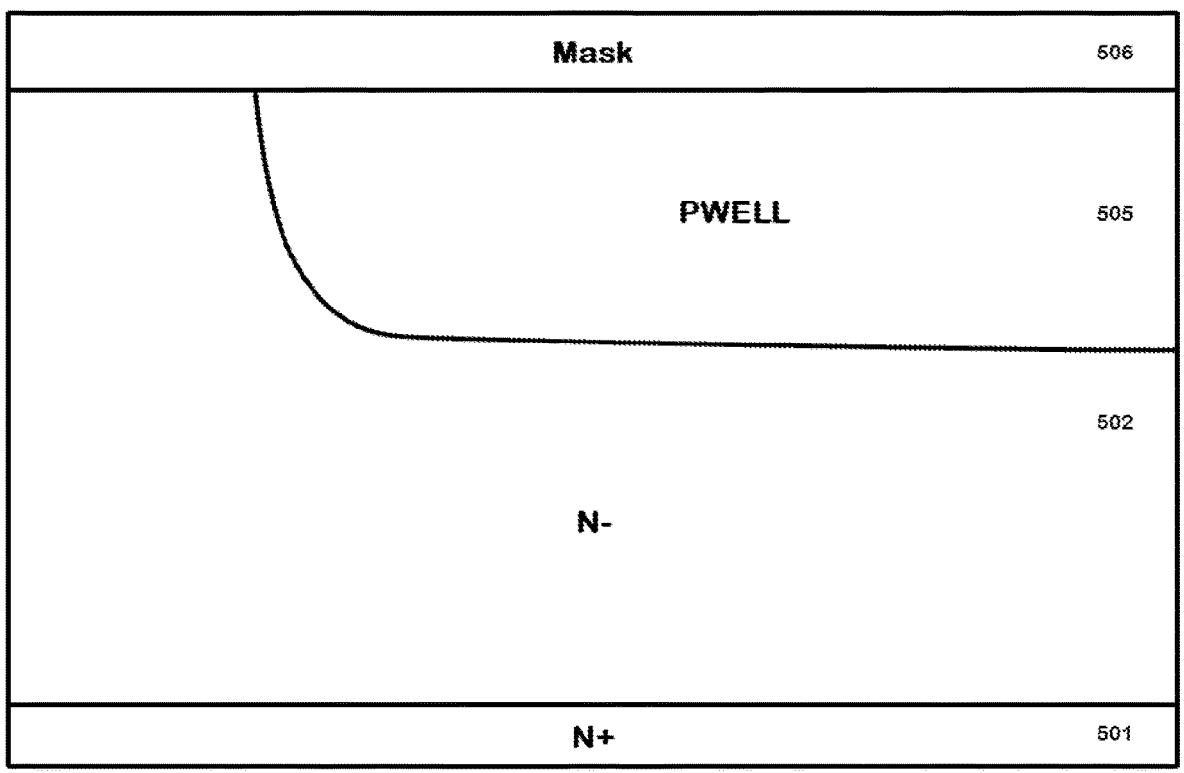
Figure 5G:
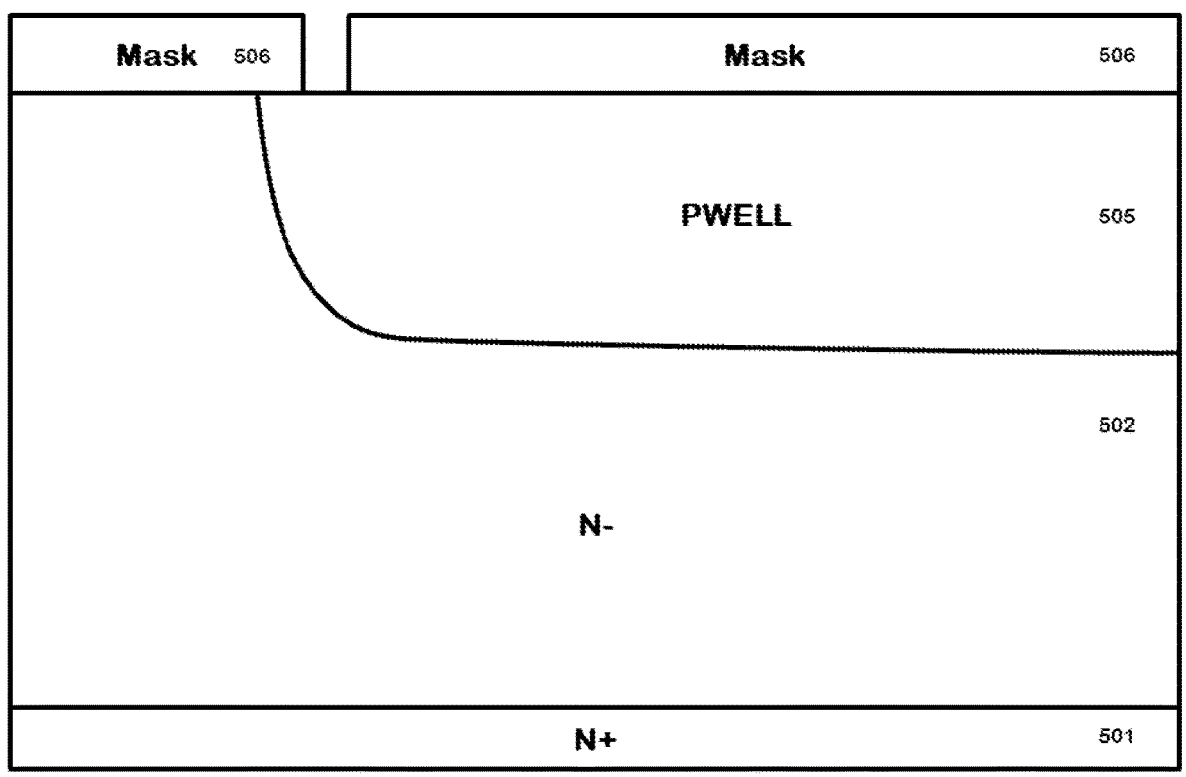
Figure 5H:
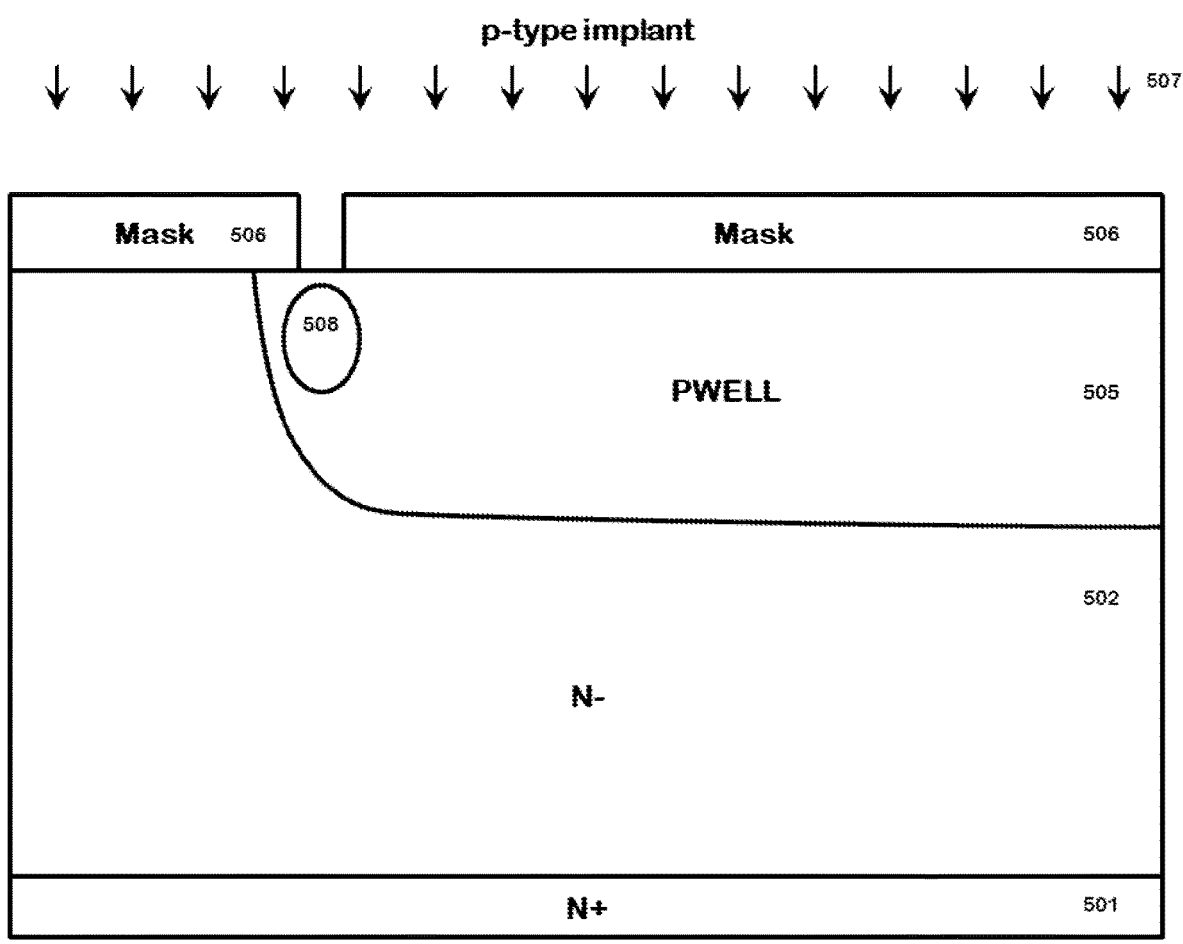
Figure 5I:
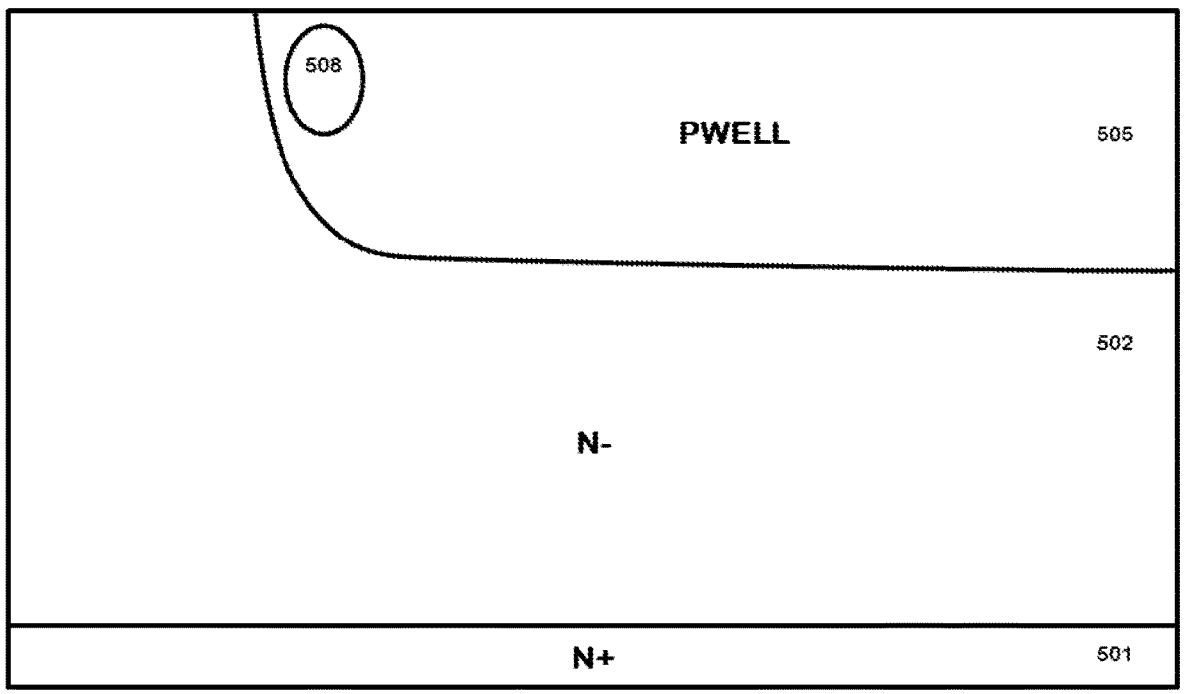
Figure 5J:
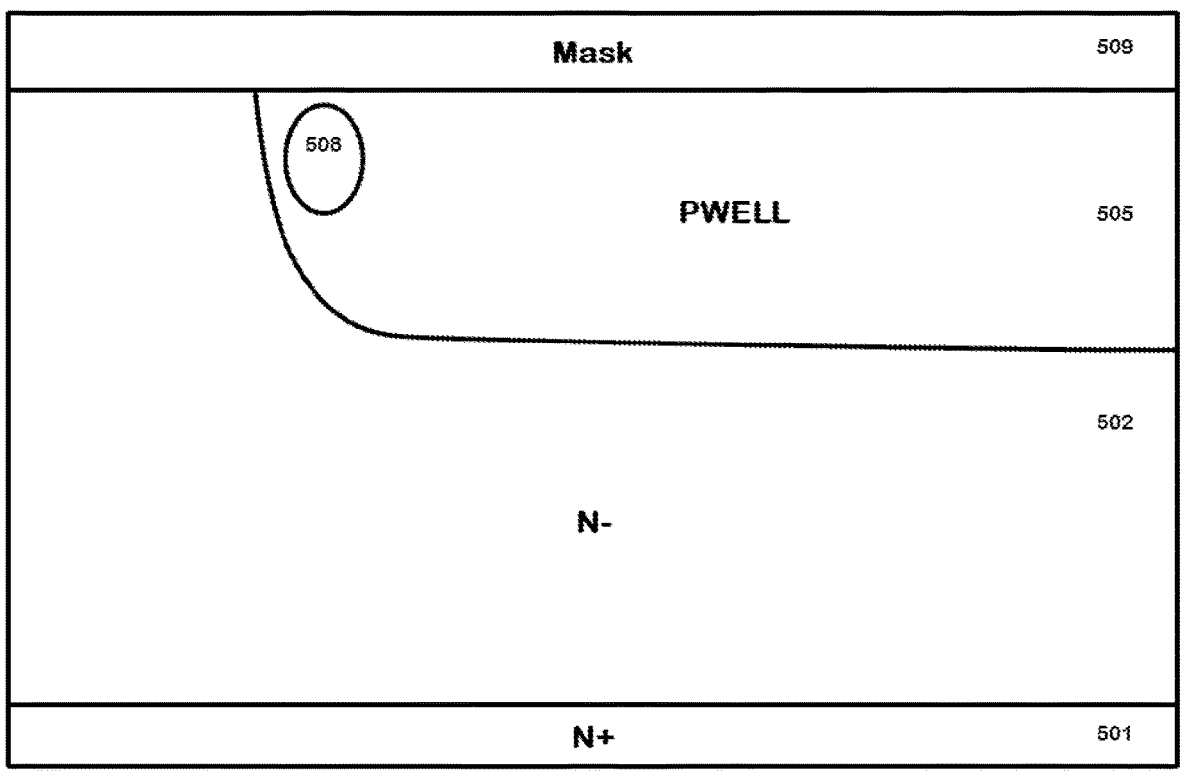
Figure 5K:
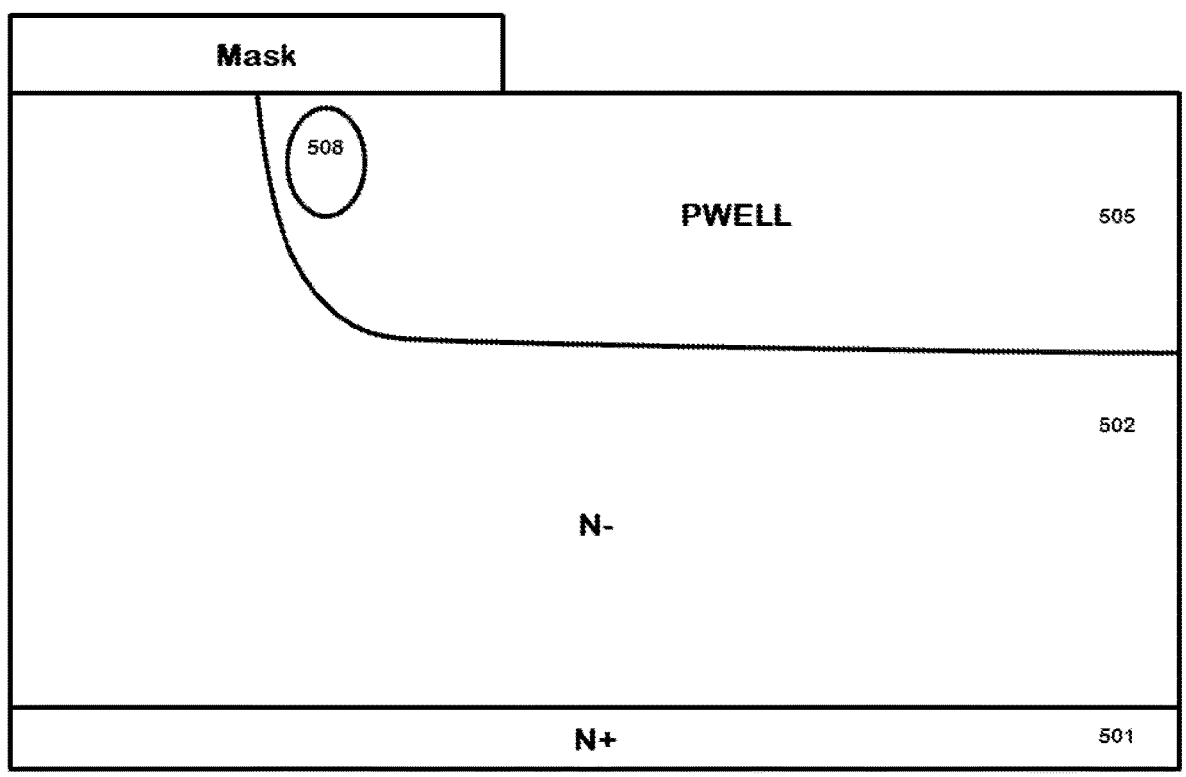
Figure 5I:
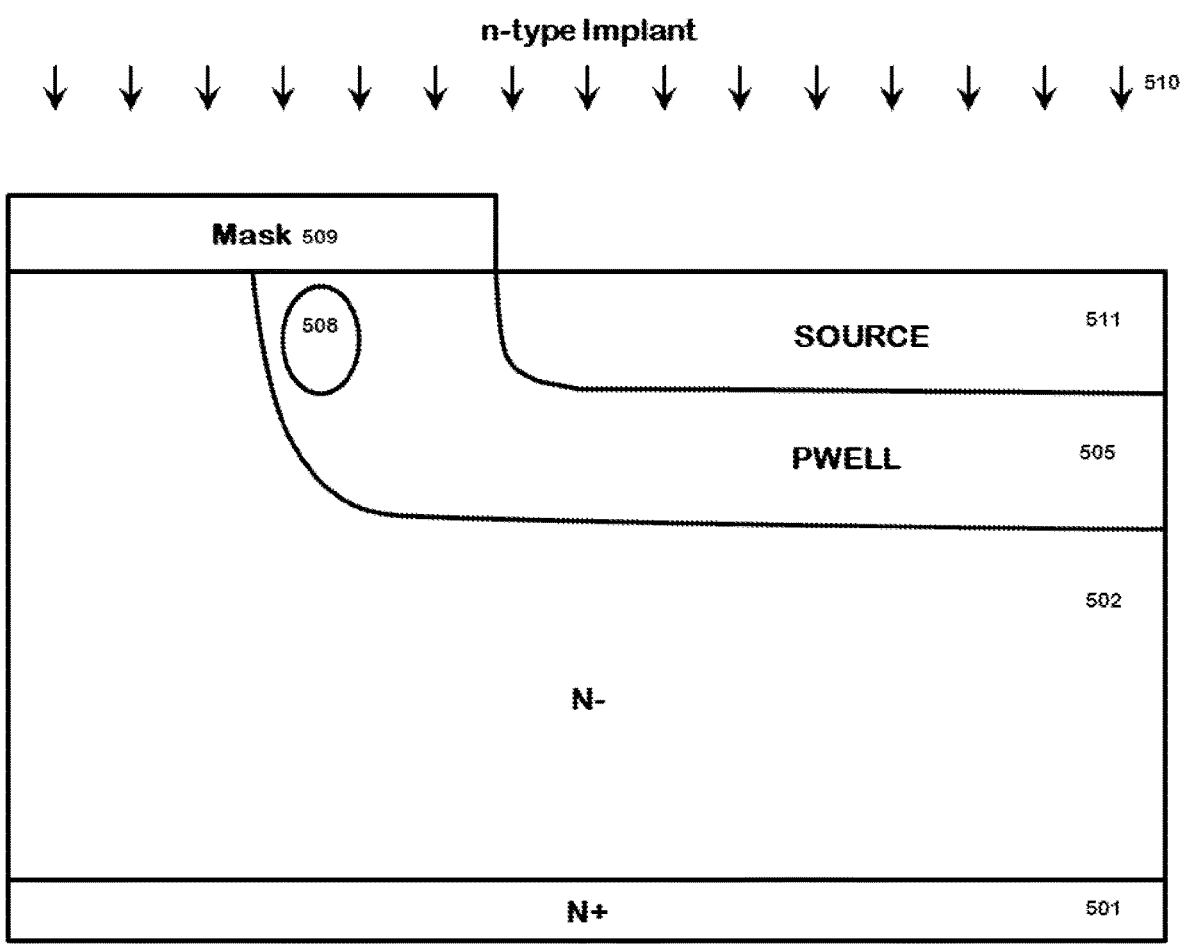
Figure 5M:
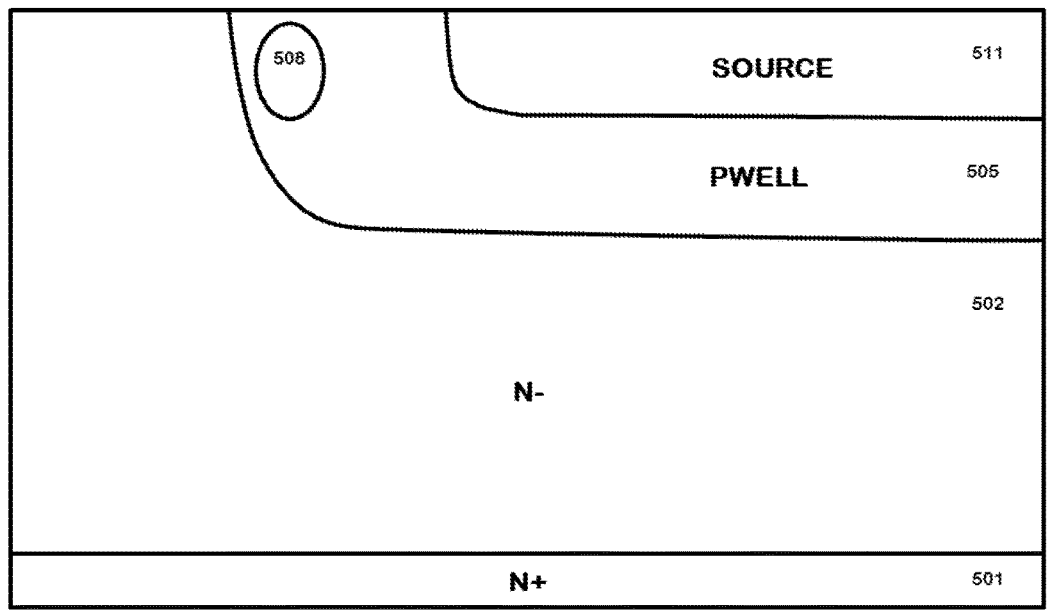
Figure 5N:
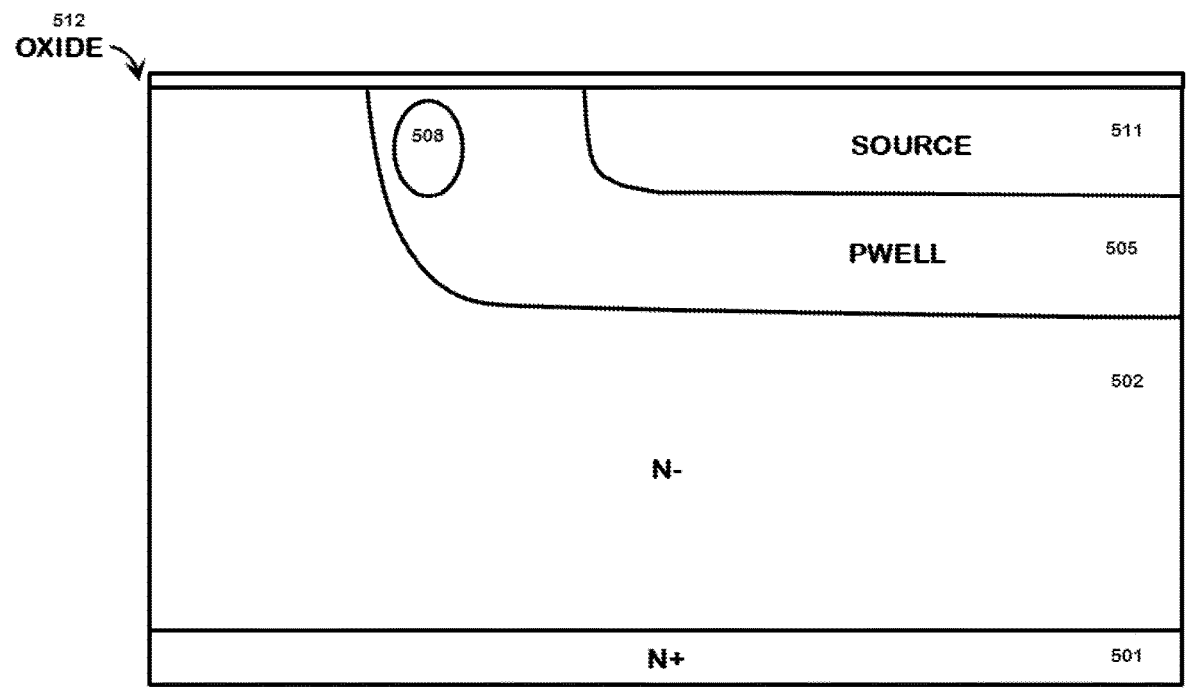
Figure 5O:
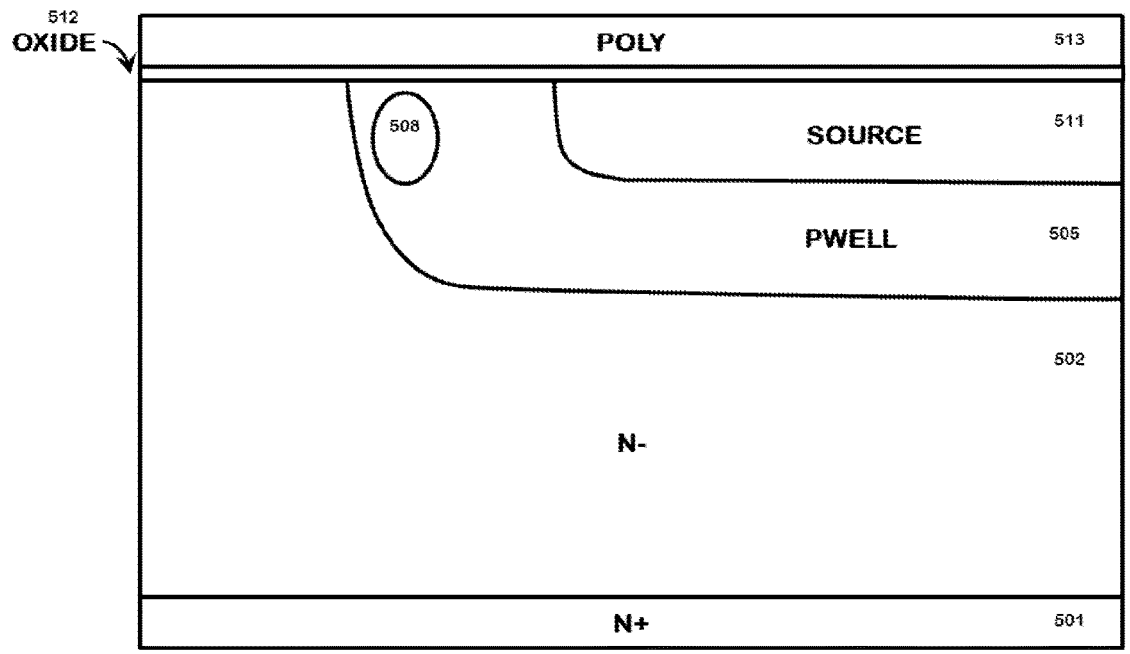
Figure 5P:
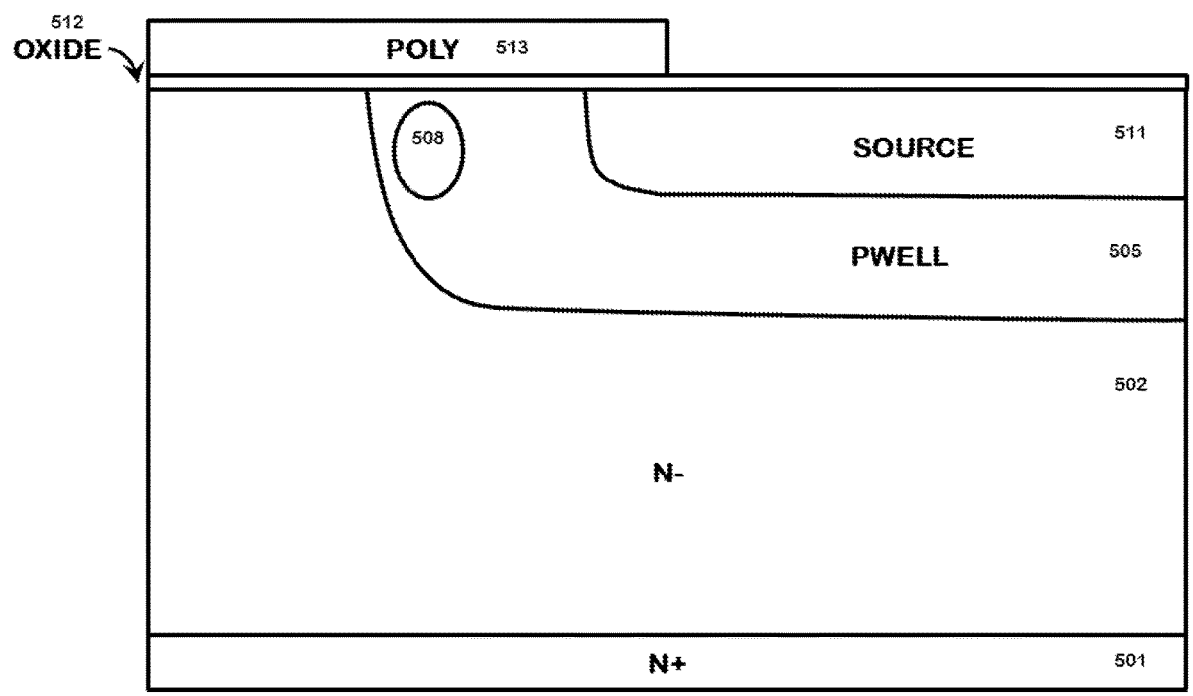
Figure 5Q:
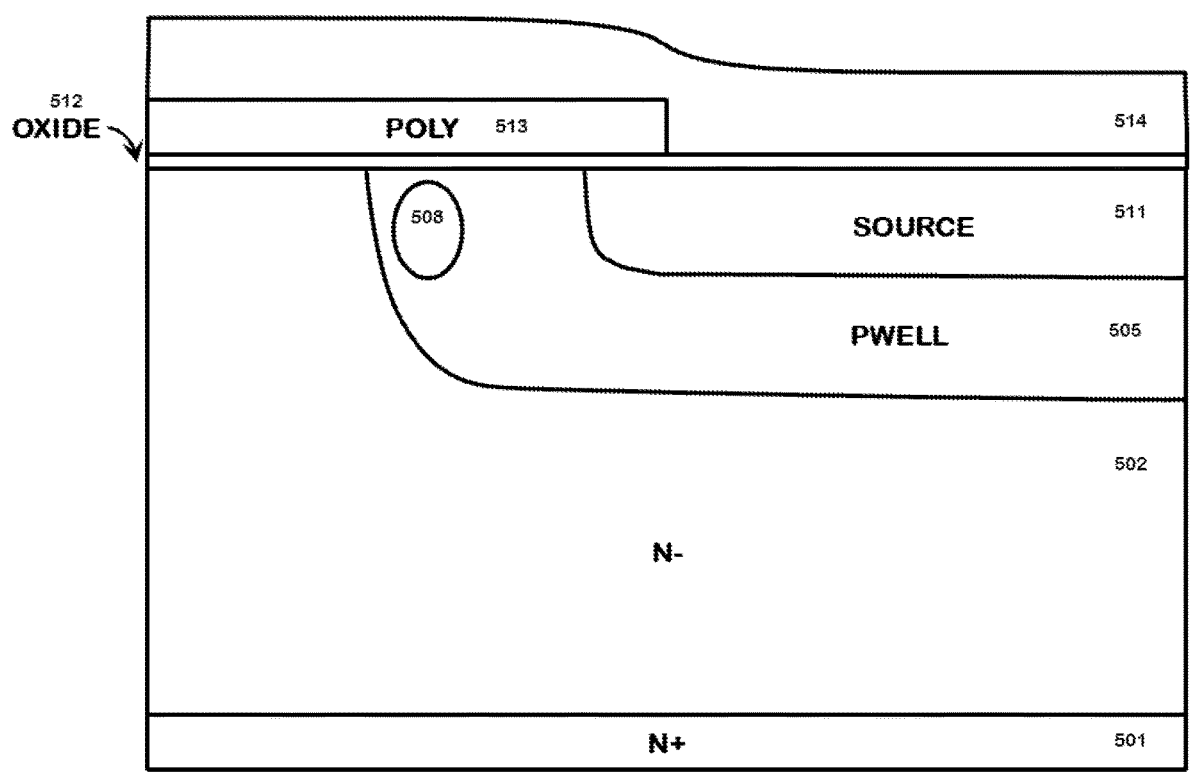
Figure 5R:
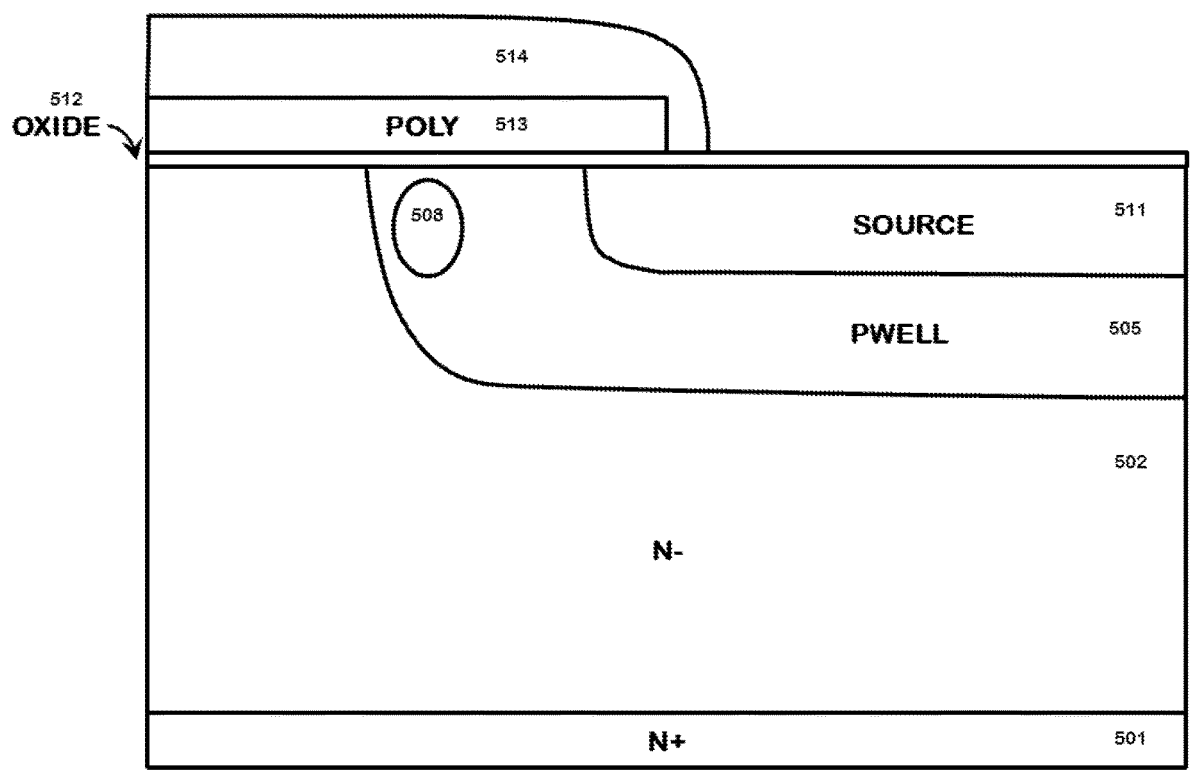
Figure 5S:
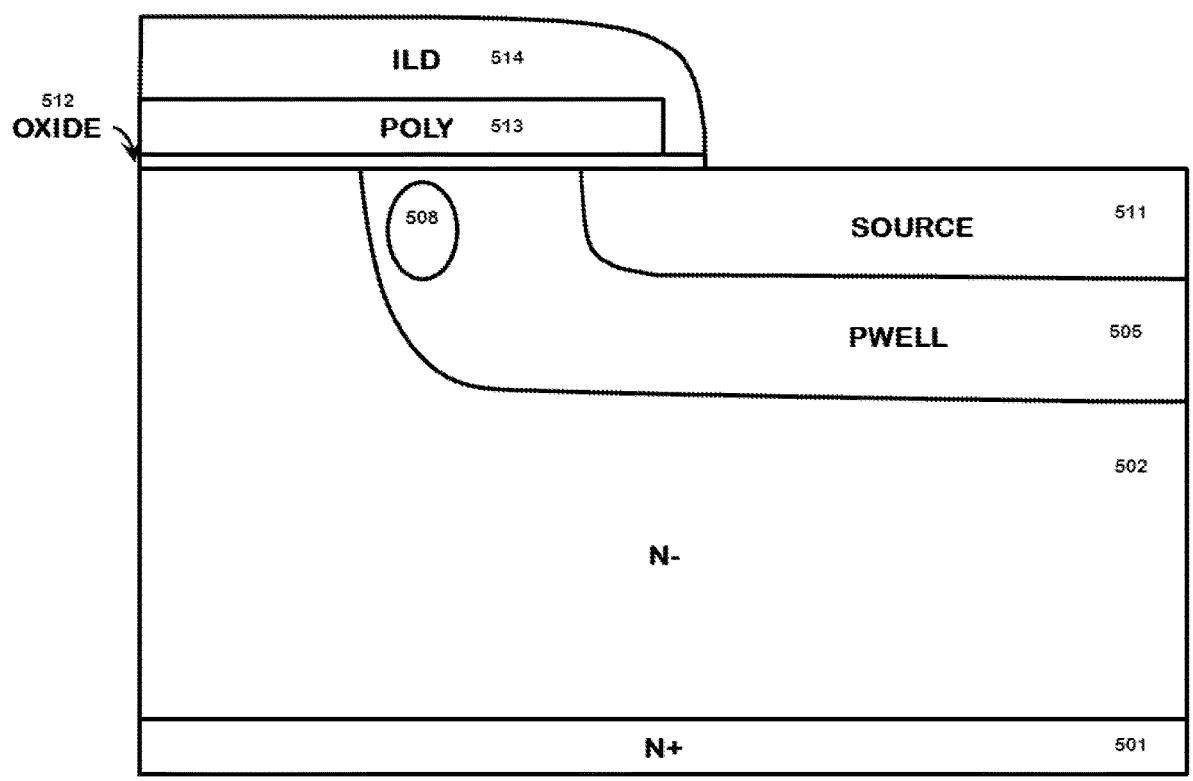
Figure 5T:
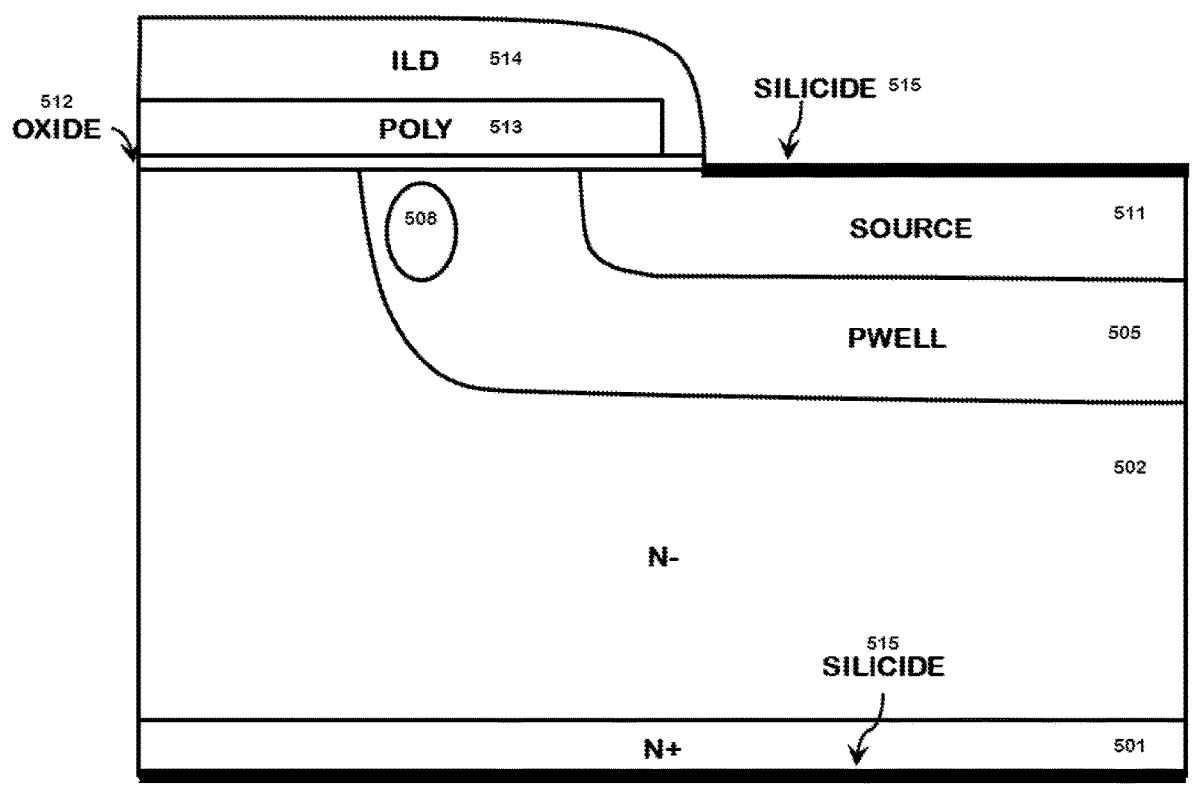
Figure 5U:
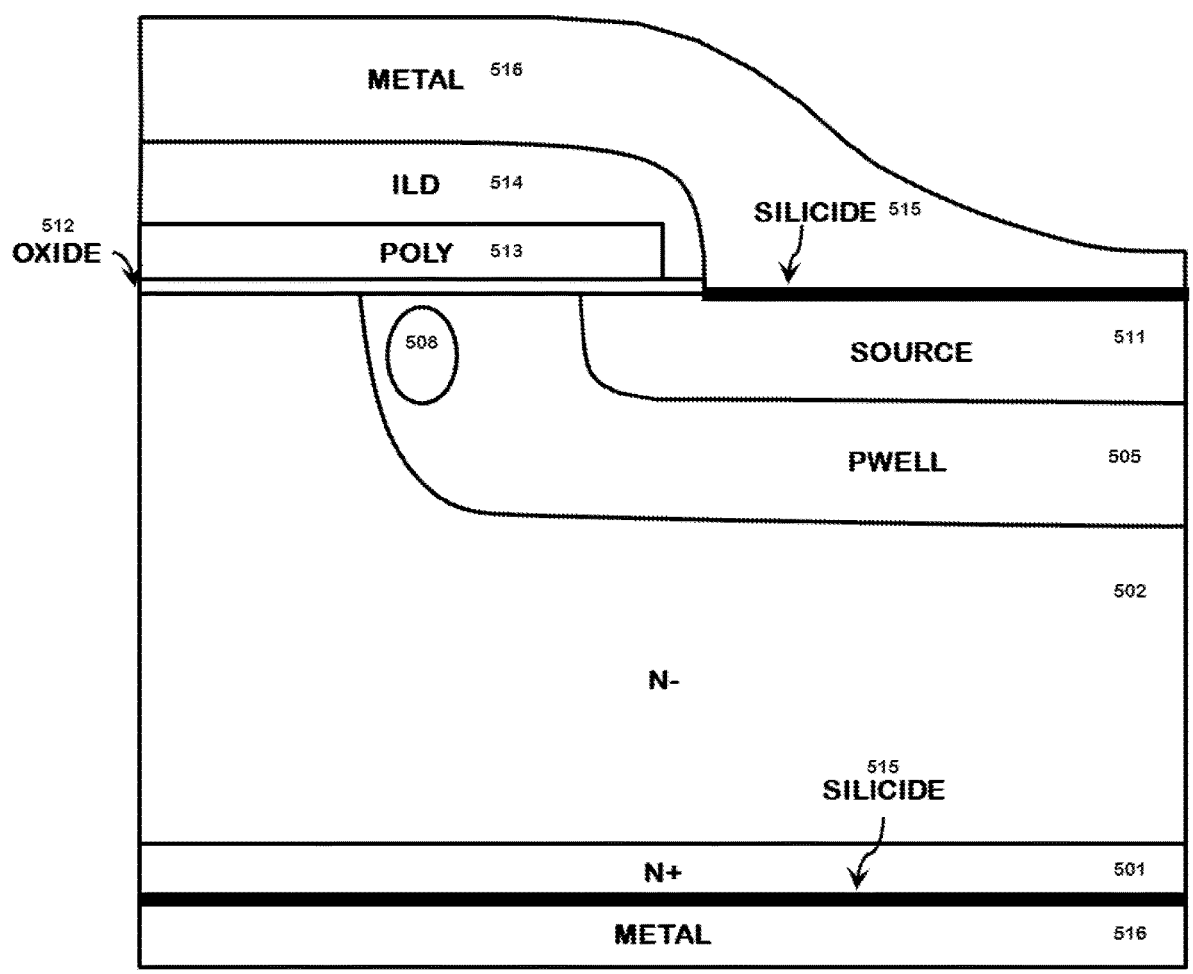

FIG. 5a to FIG. 5u describes the process of manufacturing the structure shown in FIG. 4a. The manufacturing process for a SiC DMOSFET is on a SiC substrate 501 and starts with using a 4H-SiC Si-face epi-wafer with suitable doping ($10^{14}$-$10^{18}$ cm$^{-3}$) and thickness (1 µm to 300 µm) for the epilayer 502 shown in FIG. 5a. A blanket hard mask 503 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 5b and then patterned using photolithography followed by a dry etch using reactive ion etching (RIE) for example as shown in FIG. 5c. Then p-well region is first formed by ion-implantation or epitaxial growth using aluminum or boron as the p-type impurity. A p-type implantation 504 comprising boron or aluminum, at energies ranging from 10 keV to 1000 keV, at implant doses ranging from $10^{12}$ cm$^{-2}$ to $10^{15}$ cm$^{-2}$ is performed to create a p-well 505 in FIG. 5d. The patterned mask layer 503 is removed in FIG. 5e.

A hard mask layer 506 is deposited by a CVD deposited layer of silicon dioxide, silicon nitride, silicon oxynitride, or a metallic layer such as nickel, with thickness ranging from 50 nm to 5 µm in FIG. 5f. The mask layer 506 is patterned using photolithography followed by a dry etch using RIE for example in FIG. 5g.

A p-type implant 507 is done in FIG. 5h for creating a p-type region inside the p-well called p-shield 508. The p-shield region 508 can be formed using aluminum or boron as the p-type impurity. A p-shield region is formed buried within the p-well structure. In other words, the p-shield is formed beneath the SiC surface, where the MOSFET channel is located. The p-shield region always originates within the p-well region. The location of the p-shield region, which is controlled by careful adjustment of the implant energies used for realizing the p-shield region.

The p-shield region may be created by a p-type ion-implantation step comprising boron or aluminum, at energies ranging from 25 keV to 800 keV, at implant doses ranging from $10^{12}$ cm$^{-2}$ to $10^{15}$ cm$^{-2}$. The patterned mask layer 506 is removed in FIG. 5i.

A blanket hard mask 509 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 5j and then patterned using photolithography followed by a dry etch using RIE for example as shown in FIG. 5k.

A N+ source region 511 is formed by ion-implantation or by epitaxial re-growth by a n-type impurity such as nitrogen or phosphorus 510 in FIG. 5l. The patterned mask layer 509 is removed in FIG. 5m.

The oxide layer 512 which is the gate oxide is formed by thermal oxidation or using CVD of a dielectric layer such as silicon dioxide, silicon nitride, silicon oxynitride, etc. in FIG. 5n. The thickness of the gate oxide could range from 10 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer 513 is then deposited in FIG. 5o. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. The polysilicon layer 513 is patterned in FIG. 5p. An ILD layer 514 comprising 50 nm-1000 nm thick silicon dioxide, silicon nitride, silicon oxynitride layers or a stacked combination thereof is deposited on the wafer in FIG. 5q. The ILD layer 514 is patterned in FIG. 5r. The gate oxide 512 is patterned in FIG. 5s.

Nickel silicide regions 515 are formed on the exposed SiC surface in FIG. 5t. Interconnect metal layers 516 of either aluminum or silver or gold is deposited and patterned on the top and bottom of the substrate in. FIG. 5u.

Other embodiments are also within the scope of the following claims.

Although, various embodiments which incorporate the teachings described in detail herein, those skilled in the art can readily devise many other varied embodiments that still incorporate these teachings. For example, a complementary SiC MOSFET device with a P+ substrate, P– drift layer and P+ source can be created in a N-well region. The embodiments described are all applicable to the complementary MOSFET as well.

In the embodiments and claims herein, the terms "first conductivity type region" and "second conductivity type region" are used to describe n-type and p-type regions respectively for a N type device. For a P type device "first conductivity type region" and "second conductivity type region" are used to describe p-type and n-type regions respectively.

All documents (patents, patent publications or other publications) mentioned in the specification are incorporated herein in their entirety by reference.

What is claimed is:

1. A device comprising: the device comprising SiC (Silicon Carbide), the device comprising a MOSFET (Metal Oxide Semiconductor Field Effect Transistor) channel, a junction gate field-effect transistor region, a first conductivity type well region or a second conductivity type well region, and a first conductivity type shield region or a second conductivity type shield region, wherein the first conductivity type shield region or the second conductivity type shield region is outside the junction gate field-effect transistor region, and wherein a doping concentration in the first conductivity type well region or the second conductivity type well region within the MOSFET channel is non-uniform.

2. The device of claim 1, wherein the first conductivity type shield region or the second conductivity type shield region is located inside the first conductivity type well region or the second conductivity type well region in a manner that a lateral location of a point having a higher doping concentration than that of an average background doping concentration of the first conductivity type well region or the second conductivity type well region is positioned within the first conductivity type well region or the second conductivity type well region.

3. The device of claim 1, wherein the first conductivity type shield region or the second conductivity type shield region extends beyond the first conductivity type well region or the second conductivity type well region.

4. The device of claim 3, wherein the first conductivity type shield region or the second conductivity type shield region extends beyond a vertical extent of the first conductivity type well region or the second conductivity type well region.

5. The device of claim 1, wherein the device comprises multiple first conductivity type shield regions and/or multiple second conductivity type shield regions.

6. The device of claim 1, wherein doping concentration profiles of the first conductivity type shield region or the second conductivity type shield region in different regions are different.

7. The device of claim 1, wherein doping concentration profiles of the first conductivity type shield region or the second conductivity type shield region in different regions are not substantially different.

8. A device comprising: the device comprising SiC (Silicon Carbide), the device comprising a MOSFET Metal Oxide Semiconductor Field Effect Transistor) channel, a first conductivity type well region or a second conductivity type well region, and a first conductivity type shield region or a second conductivity type shield region, wherein a doping concentration in the first conductivity type well region or the second conductivity type well region within the MOSFET channel is non-uniform, and wherein at least a portion of the first conductivity type shield region or the second conductivity type shield region is located within the first conductivity type well region or the second conductivity type well region.

9. The device of claim 8, wherein the first conductivity type shield region or the second conductivity type shield region is outside a junction gate field-effect transistor region.

10. The device of claim 8, wherein the first conductivity type shield region or the second conductivity type shield region extends beyond the first conductivity type well region or the second conductivity type well region.

11. The device of claim 8, wherein the first conductivity type shield region or the second conductivity type shield region extends beyond a vertical extent of the first conductivity type well region or the second conductivity type well region.

12. The device of claim 8, wherein the device comprises multiple first conductivity type shield regions and/or multiple second conductivity type shield regions.

13. The device of claim 8, wherein doping concentration profiles of the first conductivity type shield region or the second conductivity type shield region in different regions are different.

14. The device of claim 8, wherein doping concentration profiles of the first conductivity type shield region or the second conductivity type shield region in different regions are not substantially different.

15. The device of claim 5, wherein the multiple first conductivity type shield regions comprise at least two separate first conductivity type shield regions and/or the multiple second conductivity type shield regions comprise at least two separate second conductivity type shield regions.

16. The device of claim 15, wherein the at least two separate first conductivity type shield regions and/or the at least two separate second conductivity type shield regions extend beyond a first vertical extent of the first conductivity type well region and/or the second conductivity type well region.

17. The device of claim 15, wherein a second vertical extent of the at least two separate first conductivity type shield regions and/or the at least two separate second conductivity type shield regions are within the first conductivity type well region and/or the second conductivity type well region.

18. The device of claim 12, wherein the device comprises at least two separate first conductivity type shield regions and/or at least two separate second conductivity type shield regions.

19. The device of claim 18, wherein the at least two separate first conductivity type shield regions and/or the at least two separate second conductivity type shield regions extend beyond a first vertical extent of the first conductivity type well region and/or the second conductivity type well region.

20. The device of claim 18, wherein a second vertical extent of the at least two separate first conductivity type shield regions and/or the at least two separate second conductivity type shield regions are within the first conductivity type well region and/or the second conductivity type well region.

* * * * *